United States Patent [19]

Kitano

[11] Patent Number: 5,468,343

[45] Date of Patent: Nov. 21, 1995

[54] ETCHING SOLUTION AND ETCHING METHOD FOR SEMICONDUCTORS AND METHOD FOR EVALUATING GAAS SURFACE

[75] Inventor: Toshiaki Kitano, Itami, Japan

[73] Assignee: Mitsubishi Denki Kabushiki Kaisha, Tokyo, Japan

[21] Appl. No.: 214,765

[22] Filed: Mar. 18, 1994

[30] Foreign Application Priority Data

Mar. 19, 1993 [JP] Japan ..................................... 5-059758
Mar. 9, 1994 [JP] Japan ..................................... 6-038028

[51] Int. Cl.$^6$ ............................. H01L 21/00; C09K 13/00
[52] U.S. Cl. ..................................... 156/656.1; 156/655.1; 156/662.1; 252/79.1
[58] Field of Search ............................. 156/655.1, 656.1, 156/662.1; 252/79.1, 79.5; 437/225

[56] References Cited

U.S. PATENT DOCUMENTS 4,814,293  3/1989  Van Oekel ........................ 156/656 X

OTHER PUBLICATIONS

Broekaert et al, "Novel, organic acid-based etchants for InGaAlAs/InP heterostructure devices with AlAs etch-stop layers", J. Electrochem. Soc. (USA), vol. 139, No. 8, pp. 2306–2309, Aug. 1992.

Primary Examiner—Thi Dang
Attorney, Agent, or Firm—Leydig, Voit & Mayer

[57] ABSTRACT

An etchant includes a mixture of an organic acid, hydrogen peroxide, and a base added to adjust the pH. The etching solution has an eminent difference in the etching rates between GaAs and AlGaAs, GaAs and InGaAs, AlGaAs and InGaAs, InGaAs and AlGaAs, and InGaAs and GaAs. High selectivity etching is completed easily and with high precision. Precise control of etching of a heterostructure is achieved.

6 Claims, 37 Drawing Sheets citric acid/hydrogen peroxide

ETCHING SOLUTION AND ETCHING METHOD FOR SEMICONDUCTORS AND METHOD FOR EVALUATING GAAS SURFACE

FIELD OF THE INVENTION

The present invention relates to an etching solution for etching semiconductors and an etching method using this etching solution. The invention also relates to a method for evaluating a GaAs surface using this etching solution.

BACKGROUND OF THE INVENTION

Conventionally, acid and hydrogen peroxide, base and hydrogen peroxide, or an oxidation-reduction pair are employed as etching solutions for etching semiconductors. For example, a mixture of sulfuric acid and hydrogen peroxide and a mixture of ammonia and hydrogen peroxide are well known. FIG. 17 is a sectional view for explaining an etching method using a conventional etchant. In the figure, reference numeral 1 designates an n type AlGaAs layer. An $n^+$ type GaAs layer 2 is disposed on the n type AlGaAs layer 1. A photoresist film 3 is disposed on the $n^+$ type GaAs layer 2. Reference character d designates an etching depth from the upper surface of the GaAs layer 2, and reference character $\Delta d$ designates an over-etching depth by which the n type AlGaAs layer 1 is etched.

FIG. 18 is a sectional view for explaining an etching process in production of a high electron mobility transistor (hereinafter referred to as HEMT) using a conventional etchant. In the figure, the same reference numerals and characters as those in FIG. 17 designate the same parts. Reference numeral 4 designates a GaAs substrate. An intrinsic type (hereinafter referred to as i type) GaAs layer 5 is disposed on the GaAs substrate 4. An i type InGaAs layer 6 is disposed on the GaAs layer 5. The n type AlGaAs layer 1 is disposed on the InGaAs layer 6. The $n^+$ type GaAs layer 2 is disposed on the AlGaAs layer 1. A drain electrode 7 and a source electrode 8 are disposed on the $n^+$ type GaAs layer 2.

The threshold voltage $V_{th}$ of this HEMT is given by $$V_{th} = \phi B - \frac{qN_D W^2}{2\epsilon} - \Delta E_c \qquad (1)$$

where $\phi B$ is the Schottky barrier height, W is the thickness of the AlGaAs layer 1, $N_D$ is the donor concentration in the AlGaAs layer, $\Delta E_c$ is the energy discontinuity of the conduction band between AlGaAs and GaAs, and $\epsilon$ is the dielectric constant of AlGaAs.

In FIGS. 17 and 18, when a solution of phosphoric acid, hydrogen peroxide, and water mixed in a volume ratio of 3:1:50 is used as an etchant, the etching rates of the $n^+$ type GaAs layer 2 and the n type AlGaAs layer 1 by this etchant are about 30 nm/min. Therefore, if this etchant is used for formation of a gate recess of the HEMT shown in FIG. 18, the recess depth d has a variation $\Delta d$.

In the formula (1) representing the threshold voltage $V_{th}$ of the HEMT, since the thickness W of the AlGaAs layer depends on the recess depth d, the thickness W varies as the recess depth d varies as described above, resulting in a variation in the threshold voltage $V_{th}$ that causes unstable characteristics of the HEMT.

FIG. 31 is a sectional view of a heterojunction bipolar transistor (hereinafter referred to as HBT) for explaining an etching process using a conventional etchant. In the figure, reference numeral 23 designates an $n^-$ type GaAs layer. A p type AlGaAs base layer 22 is disposed on the $n^-$ type GaAs layer. An n type AlGaAs emitter layer 21 is disposed on the base layer 22. An etching mask 24 is disposed on the emitter layer 21. In addition, reference characters $d_1$ and $d_2$ designate etching depths.

When a solution of ammonia, hydrogen peroxide, and water mixed in a volume ratio of 5:1:100 is used as an etchant, the etching rates of the n type AlGaAs layer 21 and the p type AlGaAs layer 22 by this etchant are about 90 nm/min. Therefore, the etching time must be controlled to stop the etching at the surface of the p type AlGaAs base layer 22. However, control to the level of one atomic layer is very difficult because of the variation in the etching rate. There is a great possibility that the etching front will stop at the depth $d_2$ before reaching the surface of the p type AlGaAs base layer 22 or will stop at the depth $d_1$ after etching a portion of the base layer 22.

When the conventional etchant is employed for the base surface exposing step in the production of an HBT, i.e., etching of the n type AlGaAs emitter layer 21 to expose the surface of the p type AlGaAs base layer 22 for electrical contact, the etching depth varies as described above. In this step, the base layer 22 is unfavorably over-etched as shown in FIG. 31 because the surface of the base layer 22 must be completely exposed for electrical contact.

FIG. 10 is a diagram for explaining a relationship between the etching for exposing the base layer and the external base resistance of the HBT. In the figure, reference numeral 11 designates an emitter electrode, numeral 13 designates a base layer, numeral 14 designates an emitter layer, and numeral 15 designates a base electrode.

The base resistance $R_B$ of the HBT shown in FIG. 10 is given by $$R_B = \frac{\rho_B W_1}{X_{B1} Z_E} + \frac{\rho_B W_2}{2 X_{B2} Z_E} \qquad (2)$$

where $Z_E$ is the emitter length and $\rho_B$ is the resistivity.

The external base resistance given by the second term of the equation (2) increases because the base layer 13 is over-etched, whereby the maximum oscillation frequency $f_{max}$ of the HBT is reduced.

As described above, since the conventional etchant has no selectivity for different materials or different properties of a material, if it is employed in production of heterostructure devices, precise control is difficult.

SUMMARY OF THE INVENTION

It is an object of the present invention to provide an etching solution for etching a semiconductor heterostructure comprising GaAs/AlGaAs, GaAs/InGaAs, AlGaAs/InGaAs, InGaAs/AlGaAs, or InGaAs/GaAs, that is selective for different materials.

It is another object of the present invention to provide an etching method for precise and easy selective etching of a semiconductor device including the above described heterostructure, using the above-described etching solution.

It is still another object of the present invention to provide an etching solution having a selectivity for different properties of a semiconductor material, such as n-AlGaAs/p-AlGaAs or different surface orientations of GaAs.

It is yet another object of the present invention to provide an etching method for performing precise and easy selective etching of a semiconductor device including a junction of n-AlGaAs/p-AlGaAs or a GaAs layer.

Other objects and advantages of the invention will become apparent from-the detailed description that follows. The detailed description and specific embodiments described are provided only for illustration since various additions and modifications within the spirit and scope of the invention will be apparent to those skilled in the art from the detailed description.

According to a first aspect of the present invention, a heterostructure of an AlGaAs layer and a GaAs layer is etched with an etching solution comprising a mixture of an organic acid hydrogen peroxide, and a basic material in sufficient quantity so that the solution has a pH of 6.0 to 8.0, whereby the GaAs layer is etched selectively with respect to the AlGaAs layer. Therefore, precise control of etching of a heterostructure is achieved.

According to a second aspect of the present invention, a heterostructure of an InGaAs layer and a GaAs layer is etched with an etching solution comprising a mixture of an organic acid, hydrogen peroxide, and a basic material in sufficient quantity so that the solution has a pH exceeding 6.0, whereby the GaAs layer is etched selectively with respect to the InGaAs layer. Therefore, precise control of etching of a heterostructure is achieved.

According to a third aspect of the present invention, a heterostructure of an InGaAs layer and an AlGaAs layer is etched with an etching solution comprising a mixture of an organic acid, hydrogen peroxide, and a basic material in sufficient quantity so that the solution has a pH exceeding 7.0, whereby the AlGaAs layer is etched selectively with respect to the InGaAs layer. Therefore, precise control of etching of a heterostructure is achieved.

According to a fourth aspect of the present invention, a heterostructure of an AlGaAs layer and an InGaAs layer is etched with an etching solution comprising a mixture of an organic acid, hydrogen peroxide, and a basic material in sufficient quantity so that the solution has a pH of 4.5 to 5.5, whereby the InGaAs layer is etched selectively with respect to the AlGaAs layer. Therefore, precise control of etching of a heterostructure is achieved.

According to a fifth aspect of the present invention, a heterostructure of an GaAs layer and an InGaAs layer is etched with an etching solution comprising a mixture of an organic acid, hydrogen peroxide, and a basic material in sufficient quantity so that the solution has a pH of 4.5 to 5.5, whereby the InGaAs layer is etched selectively with respect to the GaAs layer. Therefore, precise control of etching of a heterostructure is achieved.

According to a sixth aspect of the present invention, a heterostructure of an InAlAs layer and an InGaAs layer is etched with an etching solution comprising a mixture of an organic acid, hydrogen peroxide, and a basic material in sufficient quantity so that the solution has a pH of 5.15 to 5.3, whereby the InGaAs layer is etched selectively with respect to the InAlAs layer. Therefore, precise control of etching of a heterostructure is achieved.

According to a seventh aspect of the present invention, a heterostructure of a p type AlGaAs layer and an n type AlGaAs layer is etched with an etching solution comprising a mixture of an organic acid, hydrogen peroxide, and a basic material in sufficient quantity so that the solution has a pH of 6.0 to 8.0, whereby the n type AlGaAs is etched selectively with respect to the p type AlGaAs layer. Therefore, precise control of etching of a heterostructure is achieved.

According to an eighth aspect of the present invention, a {100} GaAs surface of a GaAs layer is etched with an etching solution comprising a mixture of an organic acid, hydrogen peroxide, and a basic material in sufficient quantity so that the solution has a pH of 6.0 to 8.0, whereby the GaAs-layer is etched selectively in a direction perpendicular to the {100} GaAs surface.

According to a ninth aspect of the present invention, in a method for detecting the ratio Ga:As at a {100} GaAs surface of a GaAs layer, an etching solution comprising a mixture of an organic acid, hydrogen peroxide, and a basic material in sufficient quantity so that the solution has a pH of 6.0 to 8.0, that etches a first {100} GaAs surface whose ratio of Ga to As is previously known, is prepared, and a second {100} GaAs surface different from the first {100} GaAs surface is etched with the etching solution to detect the ratio of Ga to As of the second {100} GaAs surface by observing whether the etching solution etches the second {100} GaAs surface.

DETAILED DESCRIPTION OF THE PREFERRED EMBODIMENTS

Figure 1:
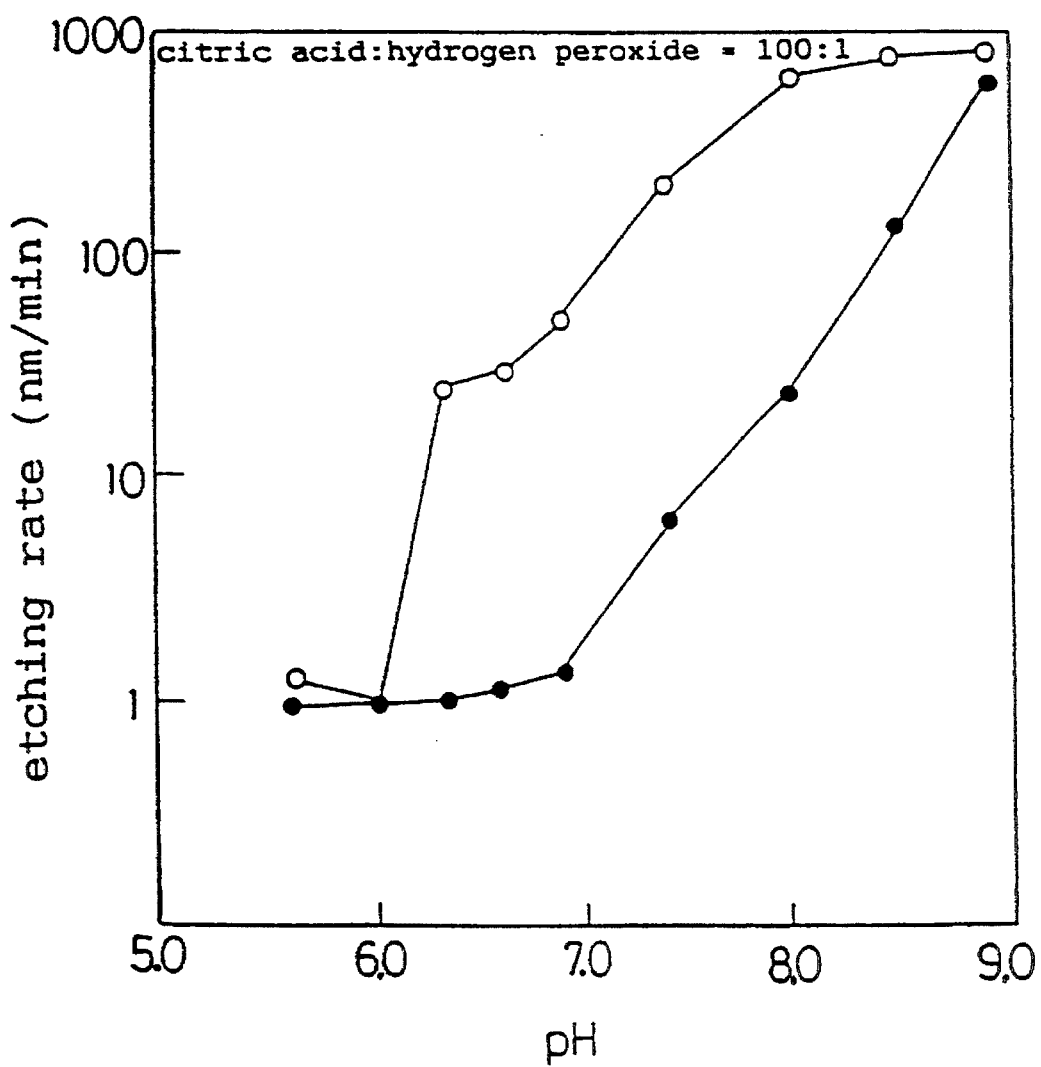
FIG. 1 is a graph illustrating pH dependence of etching rate for explaining an etchant in accordance with a first embodiment of the present invention.

An etchant according to a first embodiment of the present invention will be described. FIG. 1 is a graph illustrating pH dependencies of etching rates of GaAs and AlGaAs by a mixture of a water solution of citric acid (2% by weight) and a water solution of hydrogen peroxide (30% by weight) in a volume ratio of 100:1. In place of citric acid, generally known organic acids, such as malic acid, malonic acid, oxalic acid, and tartaric acid, may be employed. In addition, the volume ratio of the citric acid in water and the hydrogen peroxide in water is not restricted to 100:1. That is, the same result as shown in FIG. 1 is obtained if the volume ratio is in a range of 1:1 to 200:1.

Figure 2:
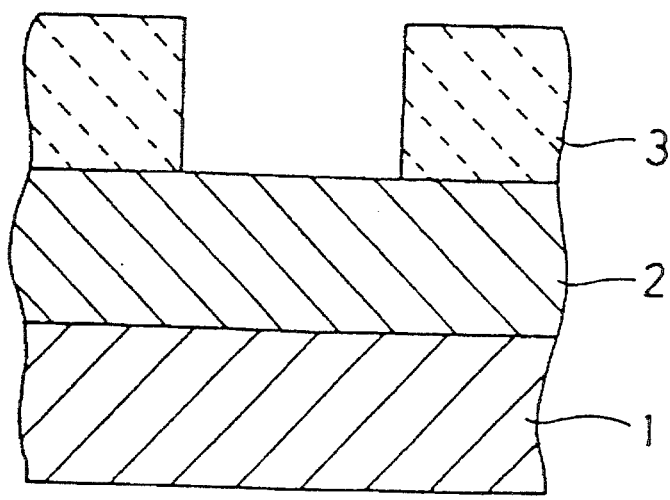
FIGS. 2(a) and 2(b) are sectional views for explaining an etching method using the etchant of the first embodiment.
Figure 2:
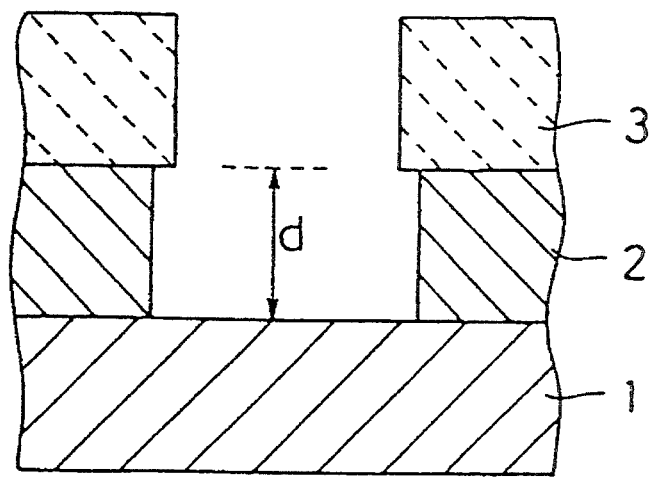

FIGS. 2(a) and 2(b) are sectional views for explaining an etching method using the etchant of this first embodiment. In these figures, reference numeral 1 designates an n type AlGaAs layer, numeral 2 designates an $n^+$ type GaAs layer, and numeral 3 designates a photoresist film.

Figure 3:
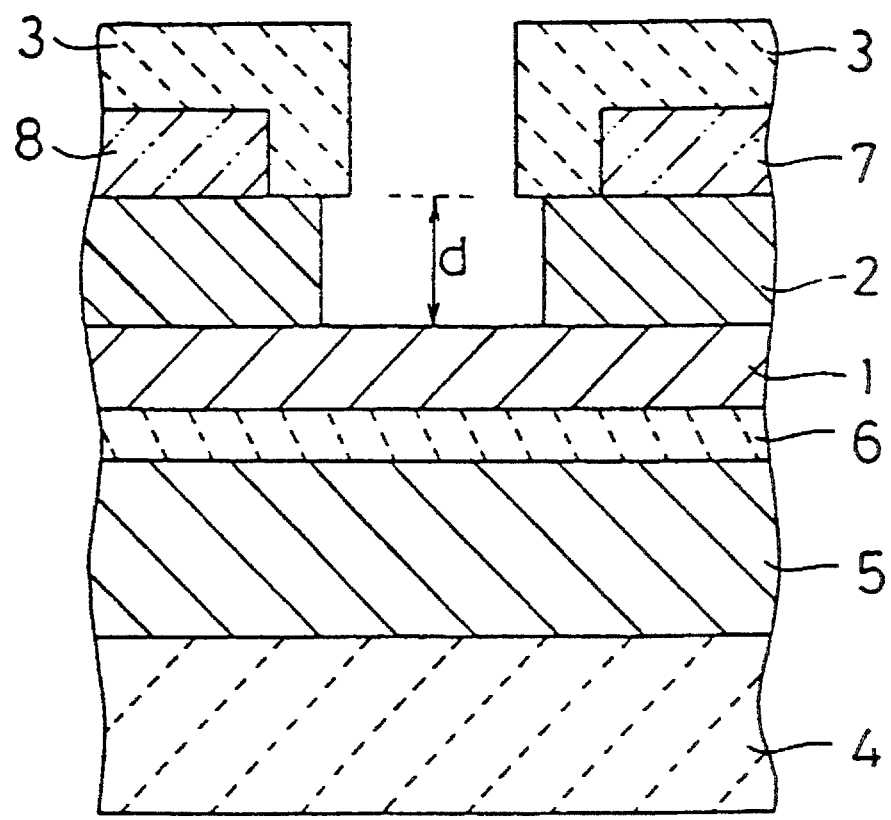
FIG. 3 is a sectional view for explaining recess etching of an HEMT using the etchant of the first embodiment.

FIG. 3 is a sectional view for explaining recess etching of an HEMT using the etchant of this first embodiment. In the figure, reference numeral 4 designates a GaAs substrate. An i type GaAs buffer layer 5 3000 Å thick is disposed on the GaAs substrate 4. An i type InGaAs channel layer 6 200 Å thick is disposed on the buffer layer 5. An n type AlGaAs electron supply layer 1 450 Å thick and having a dopant concentration of $2\times10^{18}$ $cm^{-3}$ is disposed on the channel layer 6. An $n^+$ type GaAs cap (ohmic contact) layer 2 1000 Å thick and having a dopant concentration of $3\times10^{18}$ $cm^{-3}$ is disposed on the electron supply layer 1. A drain electrode 7 and a source electrode 8 are disposed on the cap layer 2. Reference numeral 3 designates a photoresist film.

A description is given of the etchant and etching method according to the first embodiment of the present invention.

As shown in FIG. 1, when the pH of the etchant comprising citric acid in water (2% by weight) and hydrogen peroxide in water (30% by weight) mixed in a volume ratio of 100:1 is controlled by adding a basic compound, such as ammonia, selective etching between GaAs and AlGaAs is possible in a range of pH 6.0 to 8.0. That is, in the range of pH 6.0–8.0, the etching rate of GaAs by this etchant is much higher than the etching rate of AlGaAs, so that it is possible to etch GaAs selectively with respect to AlGaAs. As shown in FIGS. 2(a) and 2(b), when a heterostructure of the n type AlGaAs layer 1 and the $n^+$ type GaAs layer 2 is etched with the etchant of this embodiment using the photoresist 3 as a mask, only the $n^+$ GaAs layer 2 is selectively etched, and the etching is accurately stopped at the surface of the n type AlGaAs layer 1. Therefore, when this etchant is employed for recess etching of an HEMT as shown in FIG. 3, the $n^+$ GaAs cap layer 2 is etched selectively with respect to the n type AlGaAs electron supply layer 1, so that the etching depth d of the GaAs cap layer 2 is controlled with high precision. Accordingly, unwanted variations in the threshold voltage $V_{th}$ in the conventional etching method are avoided, resulting in HEMTs with uniform characteristics.

Meanwhile, Japanese Published Patent Application No. Sho. 63-62235 discloses a method for etching a GaAs layer selectively with respect to an AlGaAs mixed crystal layer using a mixture of ammonia water and hydrogen peroxide in water (=1:750~1:1500). In this prior art method, however, since the pH of the etchant is not precisely adjusted, the eminent difference in the etching rates as in this first embodiment of the present invention is not obtained.

According to the first embodiment of the present invention, since the pH of the etchant comprising organic acid in water and hydrogen peroxide in water in a volume ratio of 1:1~200:1 is precisely adjusted to 6.0~8.0 by adding a basic material to the etchant, an eminent difference in etching rates between the GaAs layer and the AlGaAs layer is obtained, whereby high selectivity etching is carried out easily and with high precision.

Figure 4:
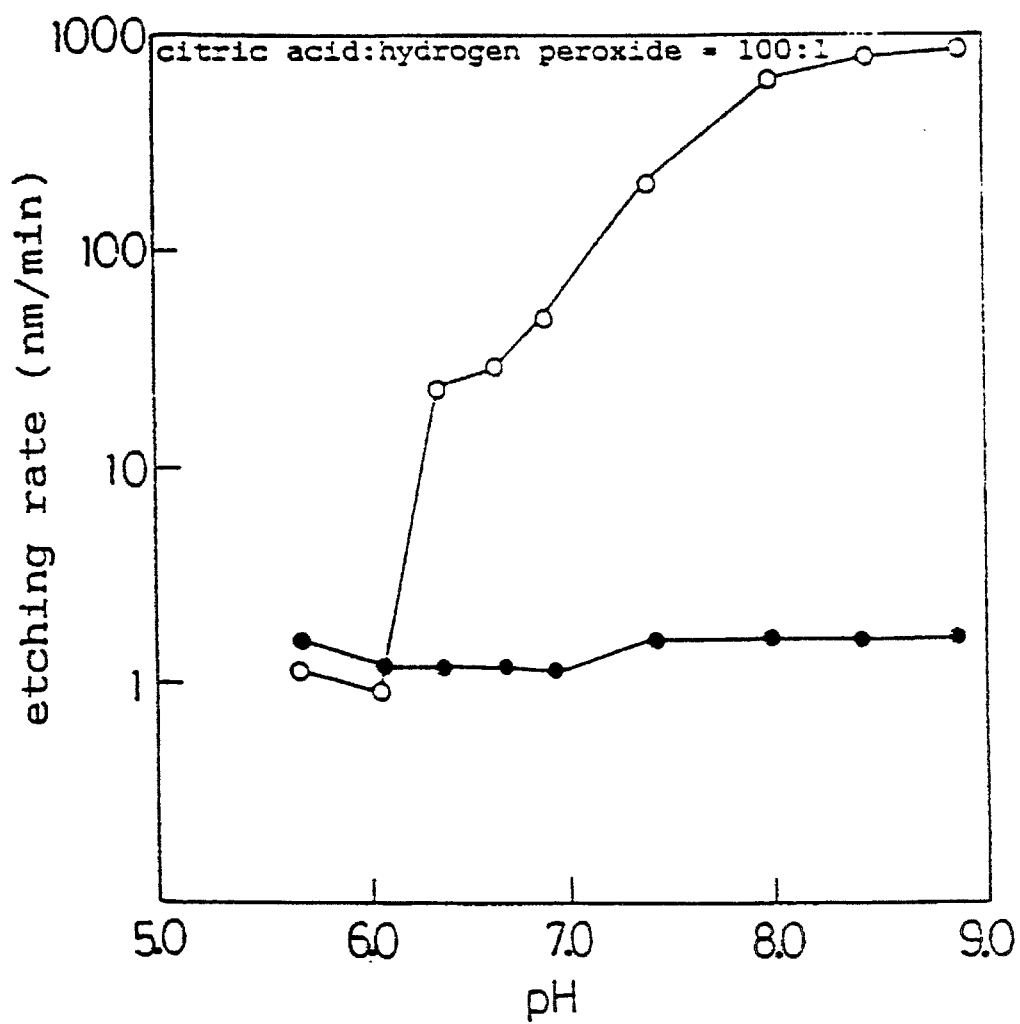
FIG. 4 is a graph illustrating pH dependence of etching rate for-explaining an etchant in accordance with a second embodiment of the present invention.

FIG. 4 is a graph for explaining an etchant according to a second embodiment of the present invention, illustrating pH dependencies of etching rates of GaAs and InGaAs by a mixture of a water solution of citric acid (2% by weight) and a water solution of hydrogen peroxide (30% by weight) in a volume ratio of 100:1. Also in this second embodiment, the organic acid included in the etchant is not restricted to citric acid. In addition, the volume ratio of organic acid in water and hydrogen peroxide water may be in a range of 1:1~200:1.

Figure 5:
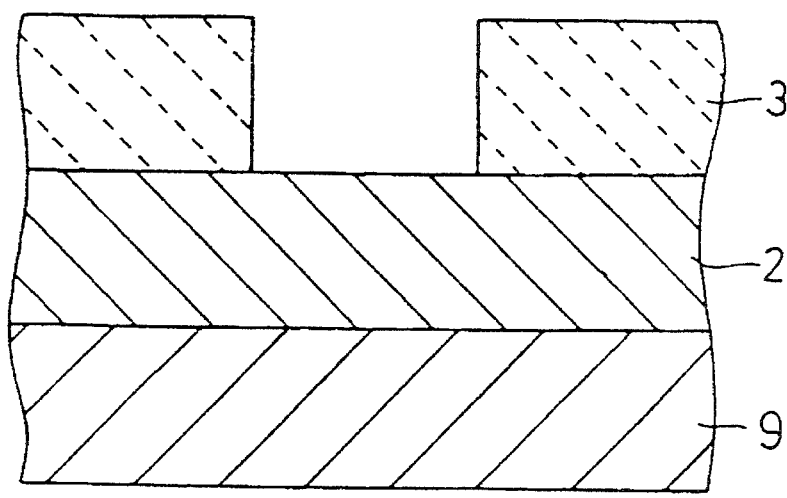
FIGS. 5(a) and 5(b) are sectional views for explaining an etching method using the etchant of the second embodiment.
Figure 5:
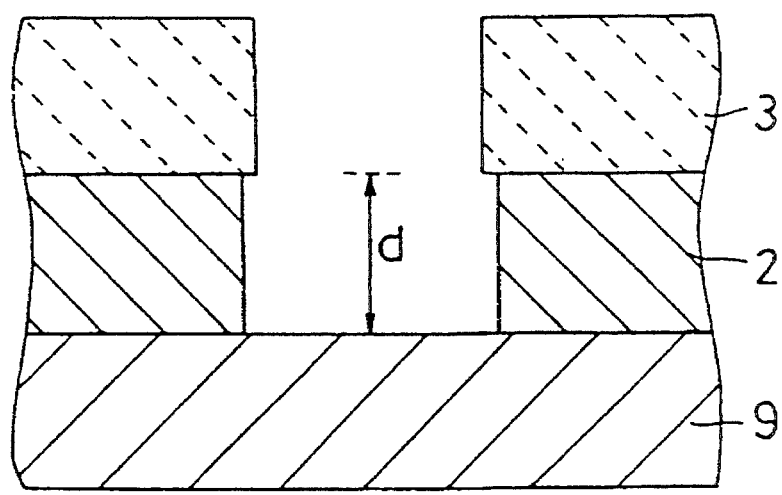

FIGS. 5(a) and 5(b) are sectional views for explaining an etching process using the etchant of this second embodiment. In these figures, reference numeral 2 designates an $n^+$ type GaAs layer, numeral 9 designates an n type InGaAs layer, and numeral 3 designates a photoresist film.

Figure 6:
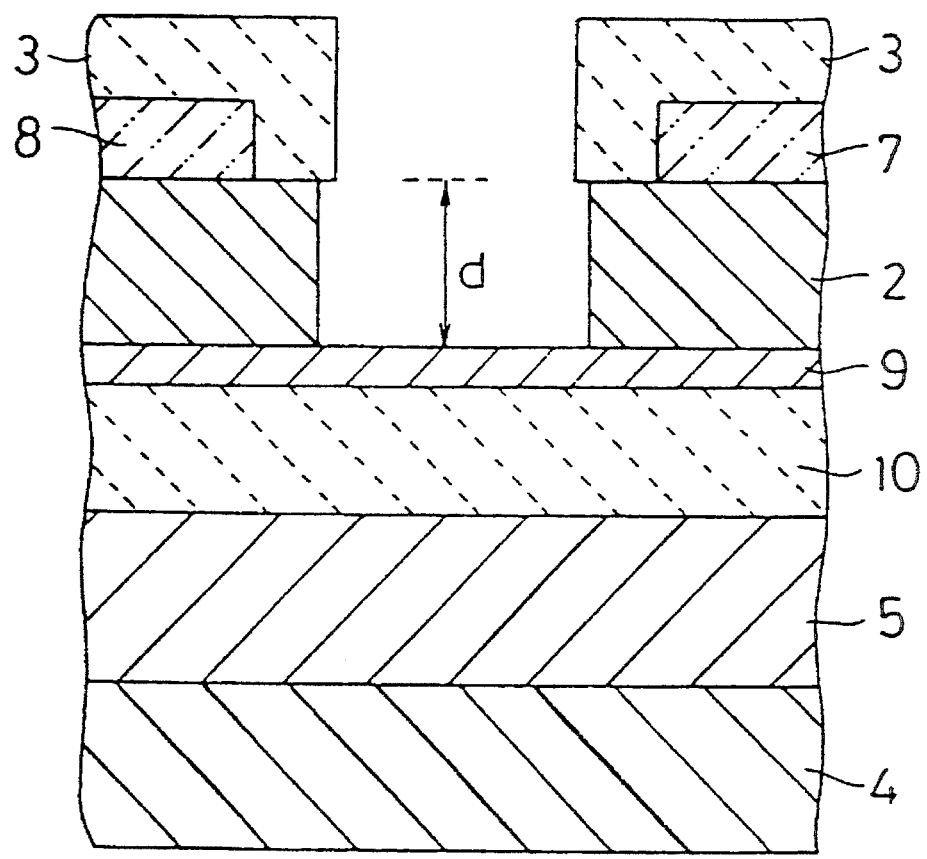
FIG. 6 is a sectional view for explaining recess etching of an HEMT using the etchant of the second embodiment.

FIG. 6 is a sectional view for explaining recess etching of a MESFET employing an n type InGaAs etch stopping layer for the etchant of this second embodiment. In FIG. 6, reference numeral 4 designates a GaAs substrate. A GaAs/AlGaAs superlattice buffer layer 5 8000 Å thick is disposed on the substrate 4. The buffer layer 5 comprises forty 50 Å thick GaAs layers and forty 150 Å thick AlGaAs layers. An n type GaAs channel layer 10 1500 Å thick and having a dopant concentration of $3\times10^{17}$ cm$^{-3}$ is disposed on the buffer layer 5. An n type InGaAs etch stopping layer 9 100~200 Å thick and having a dopant concentration of $2\times10^{17}$ cm$^{-3}$ is disposed on the channel layer 10. An $n^+$ GaAs cap layer 2 1000~3000 Å thick and having a dopant concentration of $2\times10^{18}$ cm$^{-3}$ is disposed on the etch stopping layer 9.

The threshold voltage $V_{th}$ of this MESFET is given by $$V_{th} = V_{bi} - \frac{q N_D a^2}{2\epsilon s} \quad (3)$$

wherein $V_{bi}$ is the built-in potential, q is the electron charge, $N_D$ is the donor concentration, a is the thickness of the active layer (corresponding to the layers 9 and 10 of FIG. 6), and $\epsilon s$ is the dielectric constant.

A description is given of the etchant and etching process according to the second embodiment of the present invention.

As shown in FIG. 4, when the pH of the etchant comprising citric acid in water and hydrogen peroxide in water in a volume ratio of 100:1 is adjusted to 6.0 or more by adding a basic compound, such as ammonia, to the etchant, selective etching between GaAs and InGaAs is possible. That is, in the range of pH exceeding 6.0, the etching rate of GaAs by this etchant is much higher than the etching rate of InGaAs and, therefore, it is possible to etch GaAs selectively with respect to InGaAs. As shown in FIGS. 5(a) and 5(b), when the heterostructure of the n type InGaAs layer 9 and the $n^+$ type GaAs layer 2 is etched with the etchant using the photoresist film 3 as a mask, only the $n^+$ GaAs layer 2 is etched and the etching is accurately stopped at the surface of the n type InGaAs layer 9.

Further, this etching process may be applied where recess etching of a MESFET is performed using the InGaAs etch stopping layer 9 as shown in FIG. 6. In this case, since the etching depth d is controlled with high precision, the active layer thickness a, i.e., the total thickness of the etch stopping layer 9 and the channel layer 10, is not varied, so that variations in the threshold voltage $V_{th}$ due to variations in the active layer thickness a are avoided.

Japanese Published Patent Application No. Hei. 2-206117 discloses a selective etching method for a heterostructure of a GaAs layer and an InGaAs layer of an HEMT or a MESFET. In this prior art, a mixture of citric acid, hydrogen peroxide, and water is used as an etchant, and an AlAs layer having a thickness of 30 Å that does not prevent the flow of electrons is interposed between the GaAs layer and the InGaAs layer as an etch stopping. However, formation of the AlAs etch stopping layer complicates the fabrication process of the HEMT or MESFET.

On the other hand, in the second embodiment of the present invention, since the pH of the etchant comprising an organic acid in water and hydrogen peroxide in water in a volume ratio of 1:1~200:1 is adjusted to 6.0 or more by adding a basic compound to the etchant, accurate selective etching is easily carried out without interposing an AlAs layer between the GaAs layer and the InGaAs layer.

Figure 7:
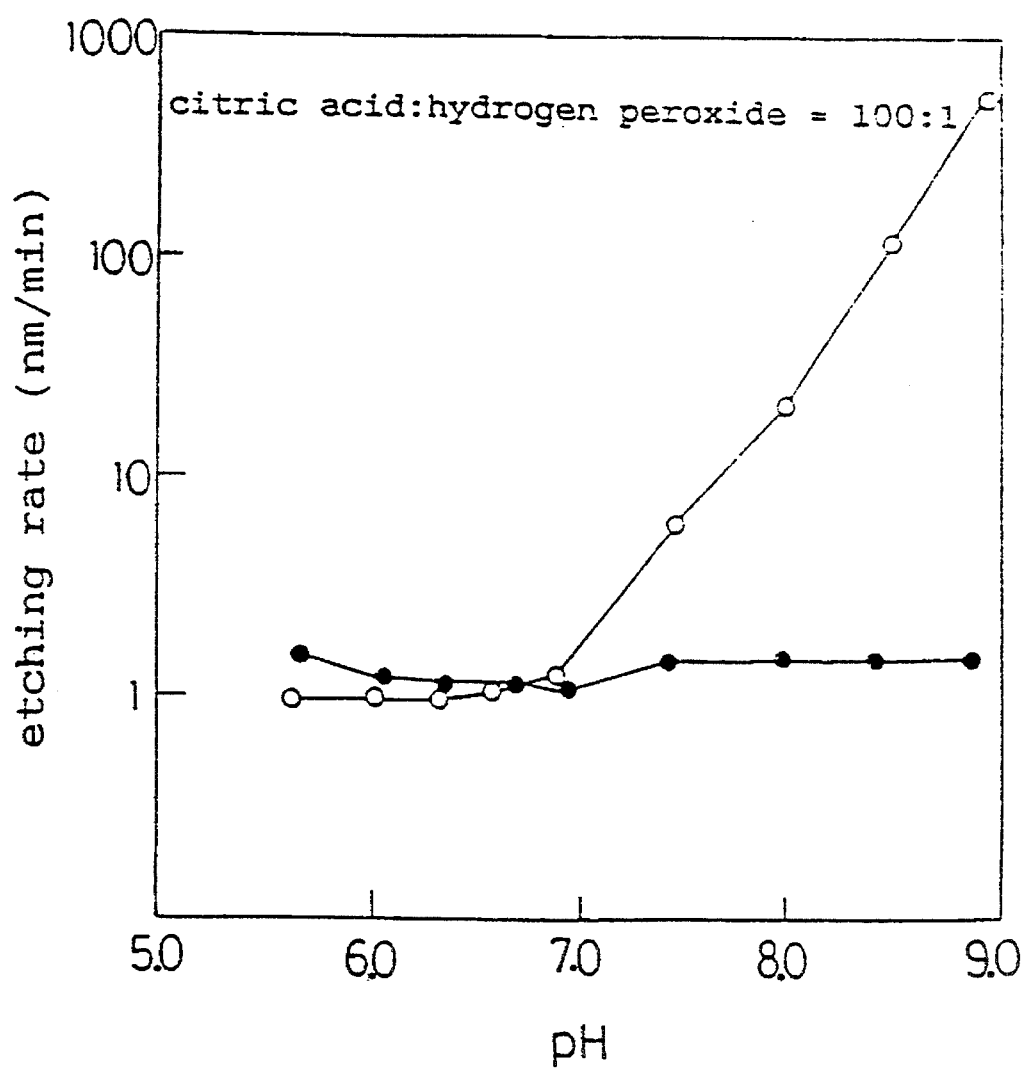
FIG. 7 is a graph illustrating pH dependence of etching rate for explaining an etchant in accordance with a third embodiment of the present invention.

FIG. 7 is a graph for explaining an etchant in accordance with a third embodiment of the present invention, illustrating pH dependencies of etching rates of AlGaAs and InGaAs by a mixture of a water solution of citric acid (2% by weight) and a water solution of hydrogen peroxide (30% by weight) in a volume ratio of 100:1. Also in this third embodiment, the organic acid included in the etchant is not restricted to citric acid. In addition, the volume ratio of organic acid in water and hydrogen peroxide in water may be in a range of 1:1~200:1.

Figure 8:
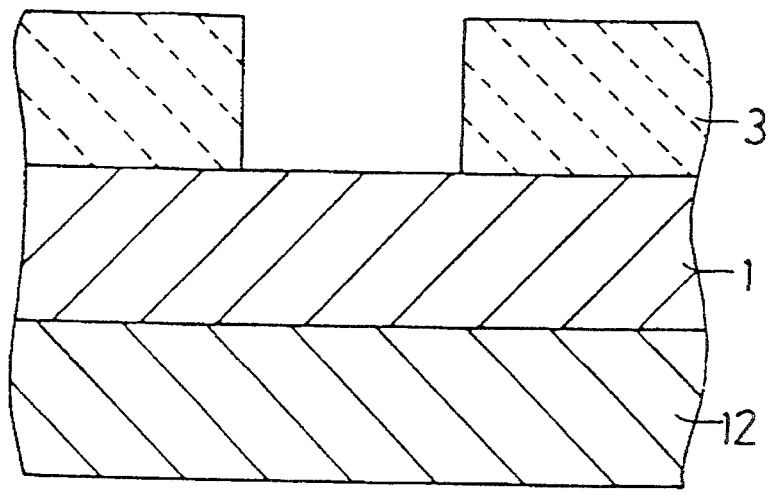
FIGS. 8(a) and 8(b) are sectional views for explaining an etching method using the etchant of the third embodiment.
Figure 8:
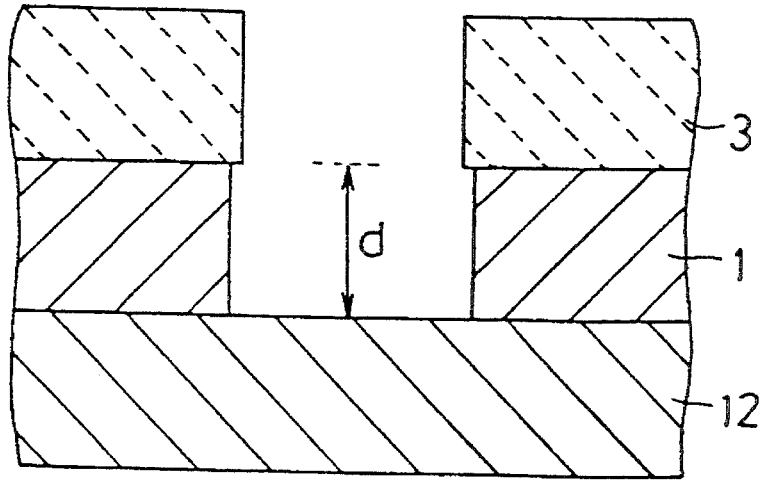

FIGS. 8(a) and 8(b) are sectional views for explaining an etching process using the etchant of this third embodiment. In these figures, reference numeral 1 designates an n type AlGaAs layer, numeral 12 designates a p type InGaAs layer, and numeral 3 designates a photoresist film.

Figure 9:
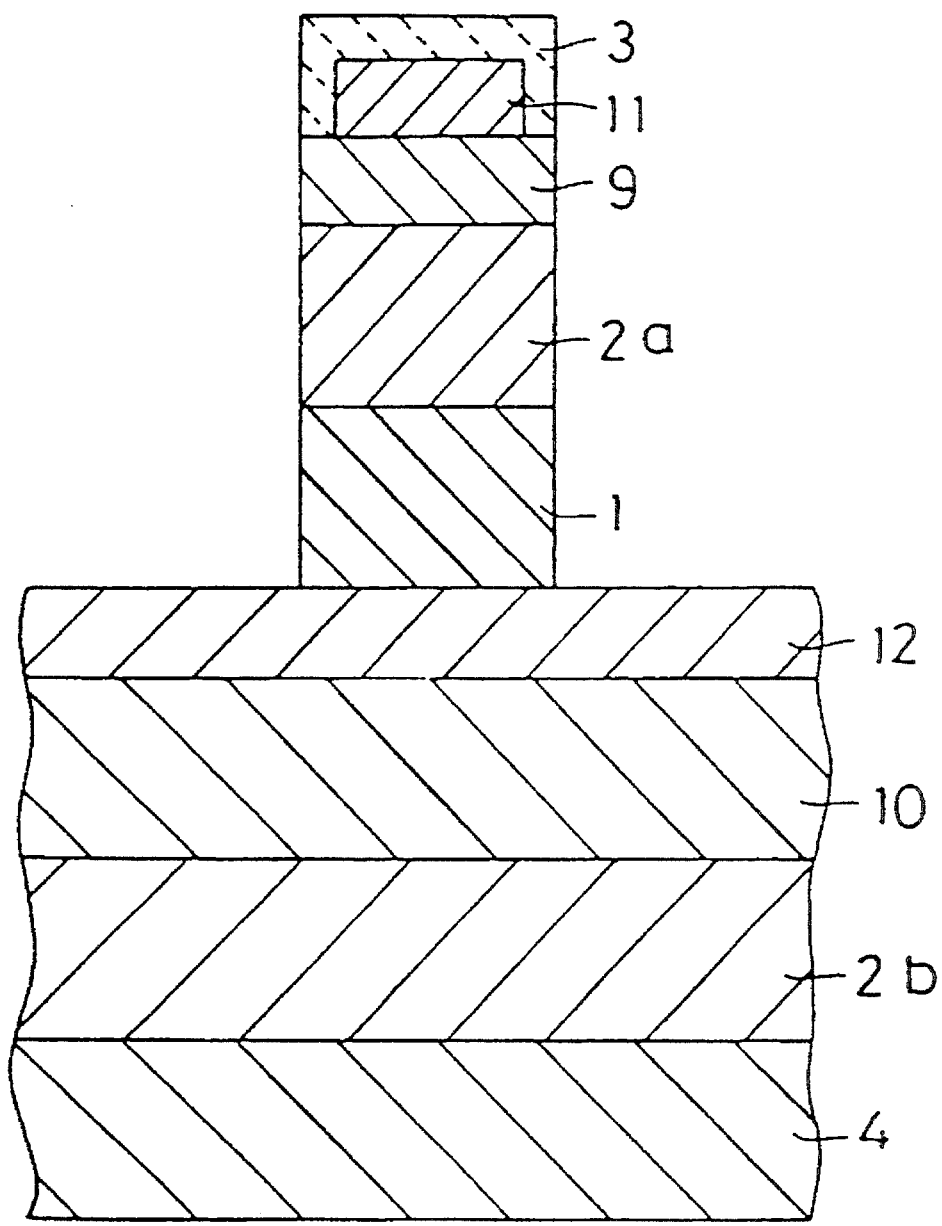
FIG. 9 is a sectional view for explaining an etching process for exposing a base layer of an HBT using the etchant of the third embodiment.

FIG. 9 is a sectional view for explaining an etching process for exposing a surface of a base layer of an HBT. In FIG. 9, reference numeral 4 designates a GaAs substrate 4. An $n^+$ type GaAs collector contact layer 2b 2000 Å thick and having a dopant concentration of $2\times10^{18}$ cm$^{-3}$ is disposed on the substrate 4. An $n^-$ type GaAs collector layer 10 2000 Å thick and having a dopant concentration of $2\times10^{17}$ cm$^{-3}$ is disposed on the collector contact layer 2b. A $p^+$ type InGaAs base layer 12 5000 Å thick and having a dopant concentration of $1\times10^{19}$ cm$^{-3}$ is disposed on the collector layer 10. An n type AlGaAs emitter layer 1 500 Å thick and having a dopant concentration of $5\times10^{17}$ cm$^{-3}$ is disposed on a part of the base layer 12. An n type GaAs emitter layer 2b 1000 Å thick and having a dopant concentration of $2\times10^{18}$ cm$^{-3}$ is disposed on the emitter layer 1. An InGaAs emitter contact layer 9 2000 Å thick and having a dopant concentration of $2\times10^{18}$ cm$^{-3}$ is disposed on the emitter layer 2b. An emitter electrode 11 is disposed on the emitter contact layer 9. Reference numeral 3 designates a photoresist film.

A description is given of the etchant and etching method according to the third embodiment of the present invention.

As shown in FIG. 7, when the pH of the etchant comprising citric acid in water and hydrogen peroxide in water in a volume ratio of 100:1 is adjusted to 7.0 or more by adding a basic compound, such as ammonia, to the etchant, selective etching between AlGaAs and InGaAs is possible. That is, in the range of pH exceeding 7.0, the etching rate of AlGaAs by this etchant is much higher than the etching rate of InGaAs and, therefore, it is possible to etch AlGaAs selectively with respect to InGaAs. As shown in FIGS. 8(a) and 8(b), when a heterostructure of the $p^+$ type InGaAs layer 12 and the n type AlGaAs layer 1 is etched with the etchant using the photoresist film 3 as a mask, only the n type AlGaAs layer 1 is etched, and the etching accurately stops at the surface of the $p^+$ type InGaAs layer 12.

This etchant can be employed for selectively etching the n type AlGaAs emitter layer 1 to expose the surface of the InGaAs base layer 12 of the HBT shown in FIG. 9. In this case, since the etching depth of the n type AlGaAs layer 1 is controlled with high precision, the p⁺ type InGaAs base layer 12 is not etched.

Figure 10:
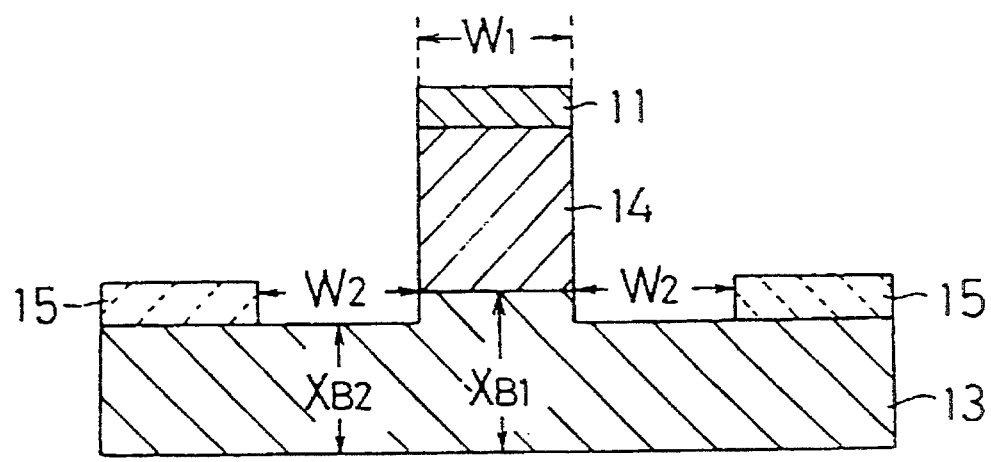
FIG. 10 is a sectional view for explaining the external base resistance in the base exposing etching of an HBT.

Generally, the base resistance $R_B$ of an HBT as shown in FIG. 10 is represented by the above-mentioned equation (2). When the surface of the base layer 13 is exposed by etching the emitter layer 14 with the conventional etchant, the external base resistance given by the second term of the equation (2) increases because $X_{B2}$ reduces due to the over-etching of the base layer 13, adversely affecting the device characteristics, such as the maximum oscillation frequency.

On the other hand, in the third embodiment of the present invention, since the above-described etchant highly selectively etches AlGaAs relative to InGaAs, the etching stops at the surface of the base layer 13 of the HBT, whereby the unwanted increase in external base resistance is prevented.

Figure 11:
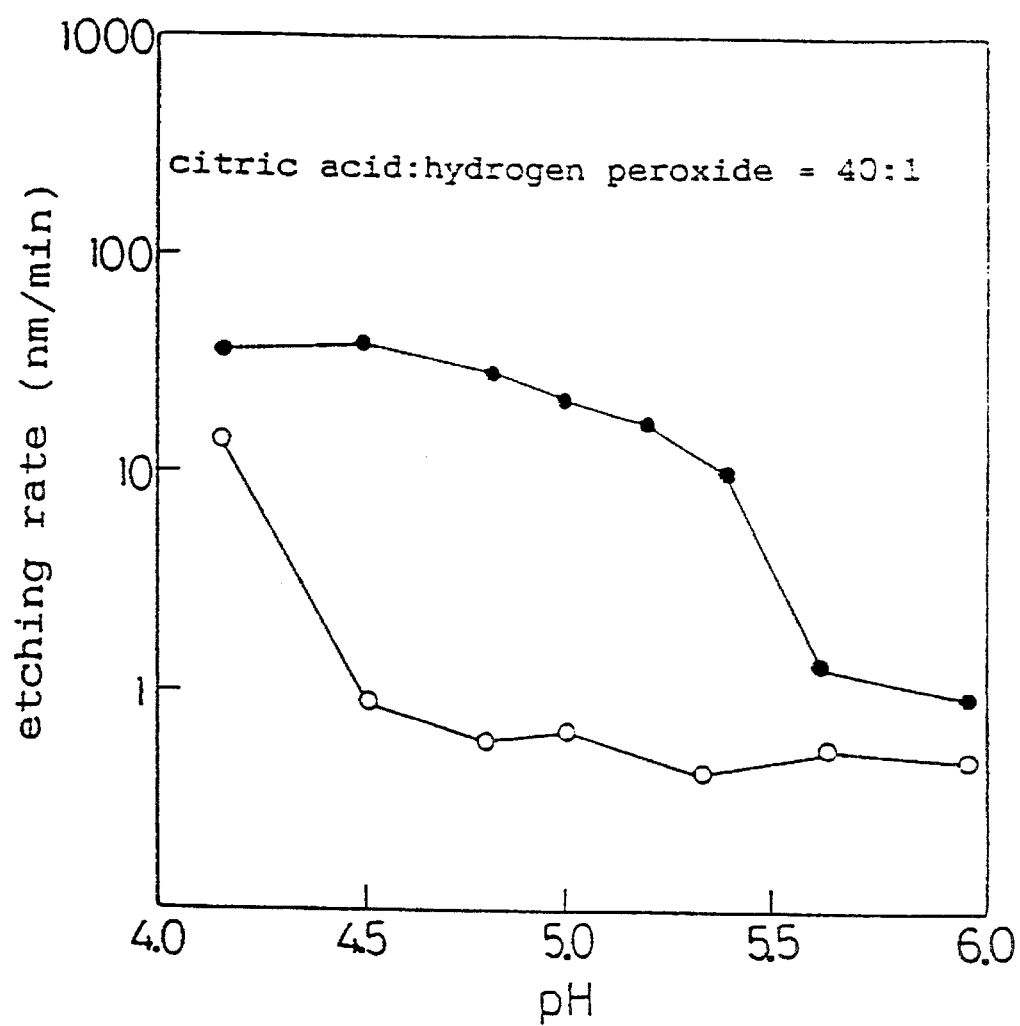
FIG. 11 is a graph illustrating pH dependence of etching rate for explaining an etchant in accordance with a fourth embodiment of the present invention.

FIG. 11 is a graph for explaining an etchant in accordance with a fourth embodiment of the present invention, illustrating pH dependencies of etching rates of InGaAs and AlGaAs by a mixture of a water solution of citric acid (10% by weight) and a water solution of hydrogen peroxide (30% by weight) mixed in a volume ratio of 40:1. Also in this fourth embodiment, the organic acid included in the etchant is not restricted to citric acid. In addition, the volume ratio of organic acid in water and hydrogen peroxide in water may be in a range of 1:1~200:1.

Figure 12:
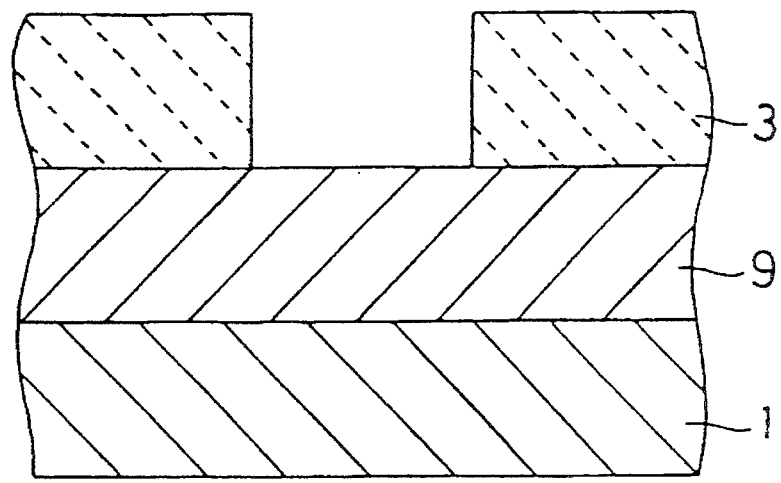
FIGS. 12(a) and 12(b) are sectional views for explaining an etching method using the etchant of the fourth embodiment.
Figure 12:
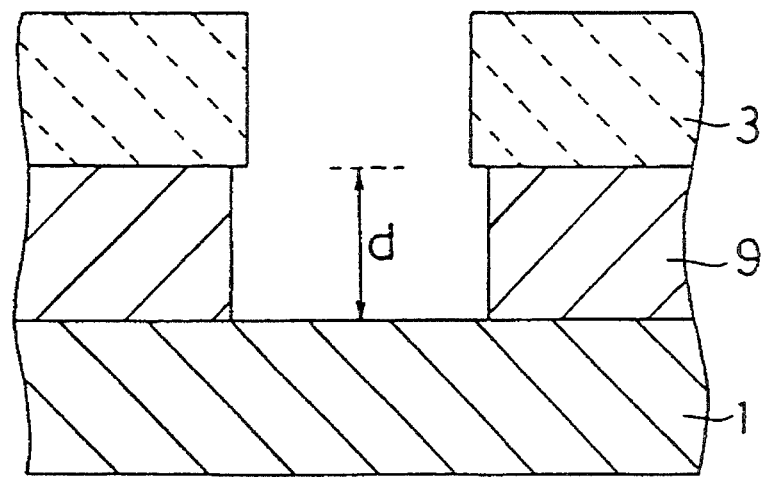

FIGS. 12(a) and 12(b) are sectional views for explaining an etching process using the etchant of this fourth embodiment. In these figures, reference numeral 1 designates an n type AlGaAs layer, numeral 9 designates an InGaAs layer, and numeral 3 designates a resist film.

A description is given of the etchant and etching method according to the fourth embodiment of the present invention. As shown in FIG. 11, when the pH of the etchant comprising citric acid in water and hydrogen peroxide in water in a volume ratio of 40:1 is adjusted to 4.5~5.5 by adding a basic compound, such as ammonia, selective etching between InGaAs and AlGaAs is possible. That is, in the range of pH 4.5~5.5, the etching rate of InGaAs by this etchant is much higher than the etching rate of AlGaAs and, therefore, it is possible to etch InGaAs selectively with respect to AlGaAs. As shown in FIGS. 12(a) and 12(b), when a heterostructure of the n type AlGaAs layer 1 and the InGaAs layer 9 is etched with this etchant using the photoresist film 3 as a mask, only the InGaAs layer 9 is etched, and the etching is accurately stopped at the surface of the n type AlGaAs layer 1.

Figure 13:
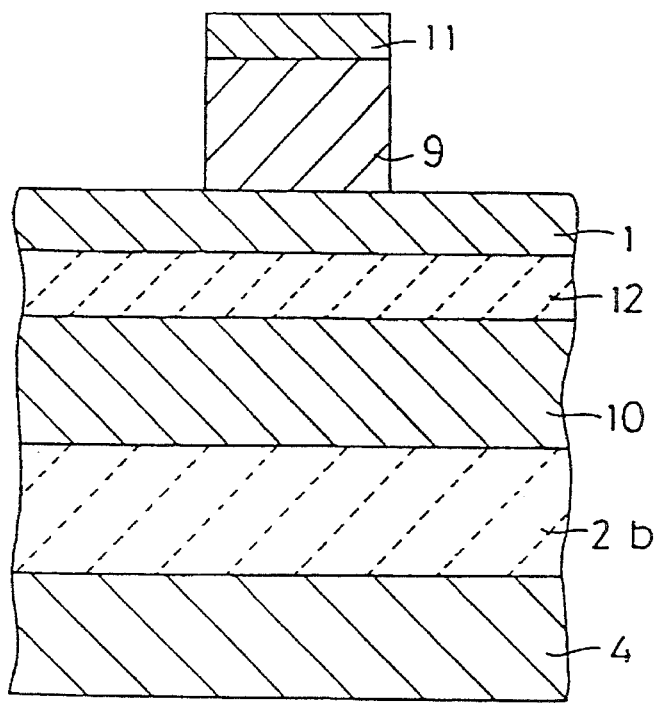
FIGS. 13(a) and 13(b) are sectional views illustrating process step for producing an HBT including an depleted emitter layer in accordance with the fourth embodiment of the present invention.
Figure 13:
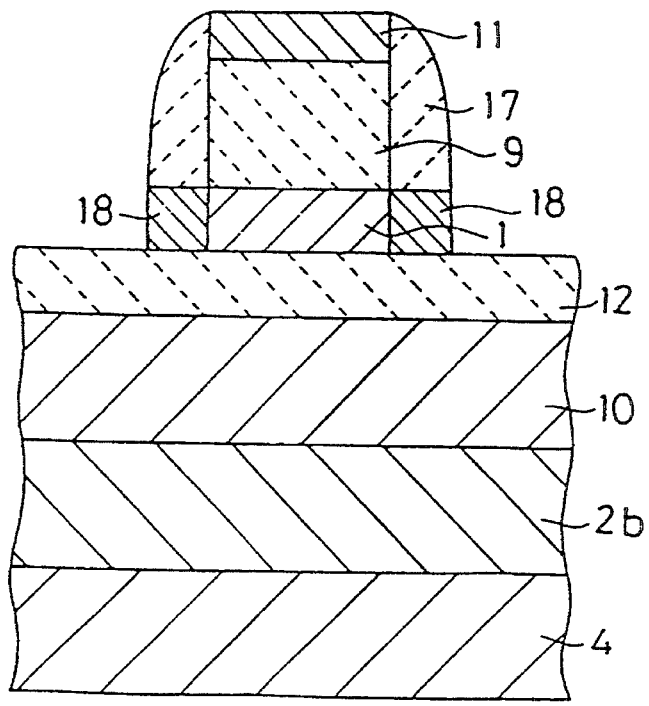

FIGS. 13(a) and 13(b) are sectional views for explaining a method of producing a depleted AlGaAs emitter layer of an HBT using the etchant of this fourth embodiment and the etchant of the above-described third embodiment. In these figures, the same reference numerals as in FIG. 9 designate the same or corresponding parts. Reference numeral 17 designates SiO₂ side walls, and numeral 18 designates depleted AlGaAs emitter layers.

In the step of FIG. 13(a), when the InGaAs emitter layer 9 is etched with the etchant of this fourth embodiment of the present invention using the emitter electrode 11 as a mask, the etching is accurately stopped at the surface of the n type AlGaAs layer 1, whereby the etching depth is controlled with high precision.

Thereafter, as illustrated in FIG. 13(b), SiO₂ side walls 17 are formed contacting opposite sides of the emitter layer 9 and the emitter electrode 11. Then, the AlGaAs emitter layer 1 is etched with the etchant according to the third embodiment of the present invention, whereby depleted AlGaAs emitter layers 18 are produced.

In this fourth embodiment of the present invention, high selectivity etching between InGaAs and AlGaAs is carried out using the above-described etchants, whereby the depleted AlGaAs emitter layers 18 are formed easily and with high precision.

Figure 14:
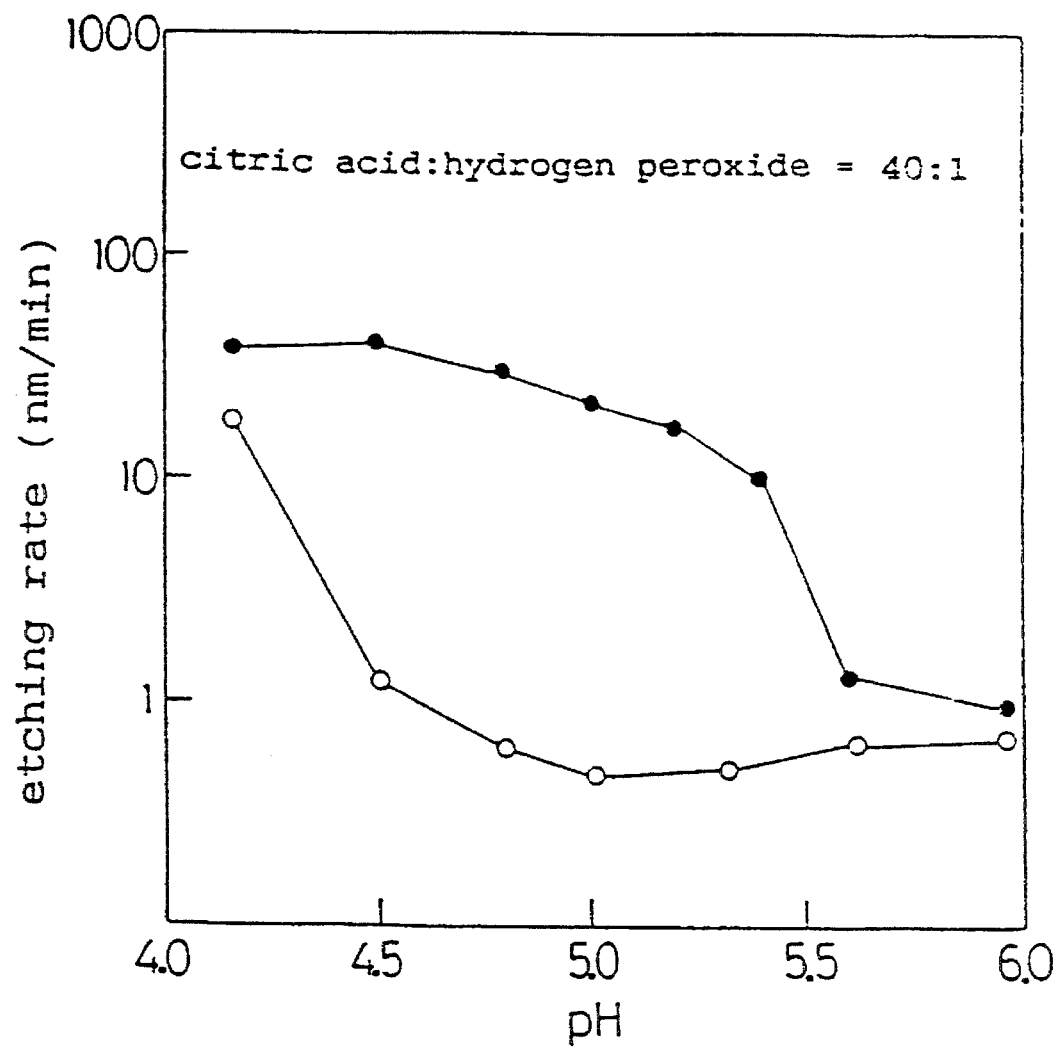
FIG. 14 is a graph illustrating pH dependence of etching rate for explaining an etchant in accordance with a fifth embodiment of the present invention.

FIG. 14 is a graph for explaining an etchant in accordance with a fifth embodiment of the present invention, illustrating pH dependencies of etching rates of InGaAs and GaAs by a mixture of a water solution of citric acid (10% by weight) and a water solution of hydrogen peroxide (30% by weight) mixed in a volume ratio of 40:1. Also in this fifth embodiment, an organic acid included in the etchant is not restricted to citric acid. In addition, the volume ratio of organic acid in water and hydrogen peroxide in water may be in a range of 1:1~200:1.

FIGS. 15(a) and 15(b) are sectional views for explaining an etching process using the etchant of this fifth embodiment. In these figures, reference numeral 2 designates an n⁺ type GaAs layer, numeral 9 designates an InGaAs layer, and numeral 3 designates a photoresist film.

A description is given of the etchant and etching method according to the fifth embodiment of the present invention.

Figure 15:
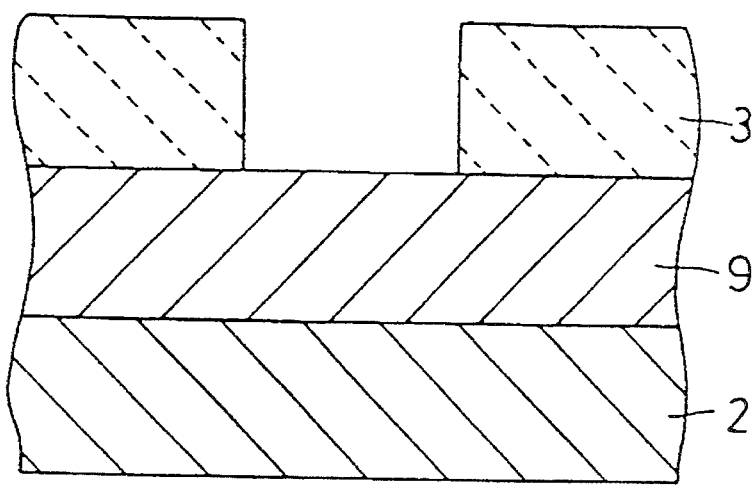
FIGS. 15(a) and 15(b) are sectional views for explaining an etching method using the etchant of the fifth embodiment.
Figure 15:
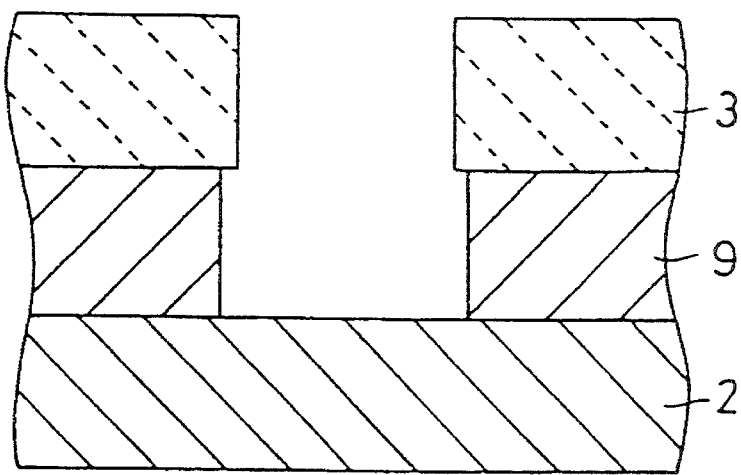

As shown in FIG. 14, when pH of the etchant comprising citric acid in water and hydrogen peroxide in water in a volume ratio of 40:1 is adjusted to 4.5~5.5 by adding a basic compound, such as ammonia, selective etching between InGaAs and GaAs is possible. That is, in the range of pH 4.5~5.5, the etching rate of InGaAs by this etchant is much higher than the etching rate of GaAs. Therefore, it is possible to etch InGaAs selectively with respect to GaAs. When the heterostructure of n type GaAs layer 10 and the InGaAs layer 9 shown in FIG. 15 is etched with this etchant, only the InGaAs layer 9 is etched and the etching is accurately stopped at the surface of the n type GaAs layer 2.

Figure 16:
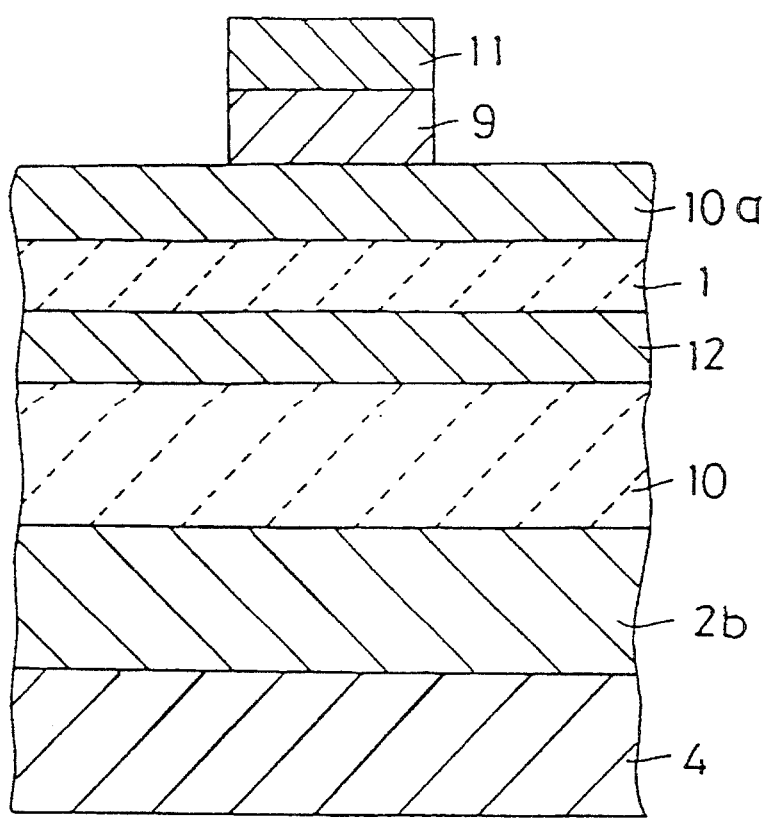
FIG. 16 is a sectional view for explaining an etching process of an emitter of an HBT using the etchant of the fifth embodiment.
Figure 17:
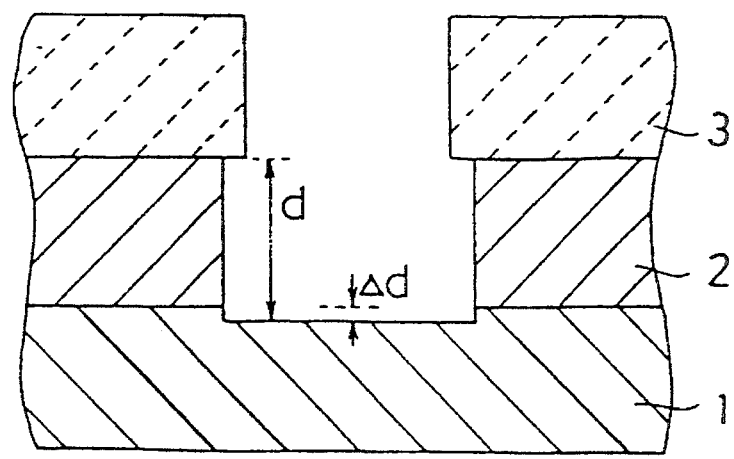
FIG. 17 is a sectional view for explaining an etching process according to the prior art.
Figure 18:
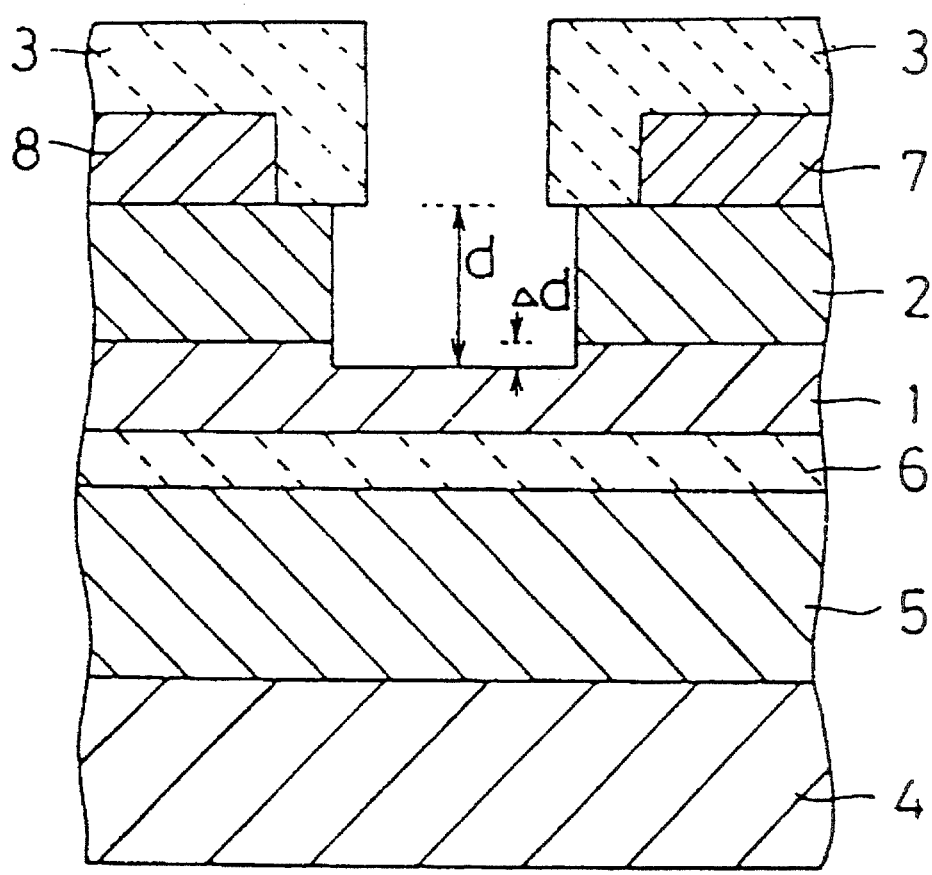
FIG. 18 is a sectional view for explaining recess etching of an HEMT according to the prior art.

FIG. 16 is a sectional view of an HBT for explaining etching of an InGaAs emitter layer of the HBT using the above-described etchant. In FIG. 16, the same reference numerals as in FIG. 9 designate the same or corresponding parts. Reference numeral 10a designates an n type GaAs emitter layer 1000 Å thick and having a dopant concentration of $2 \times 10^{18}$ cm⁻³. In this etching process, the InGaAs emitter layer 9 is etched with high precision, selectively with respect to the n type GaAs emitter layer 10, whereby the characteristics of the HBT are made uniform.

Figure 35:
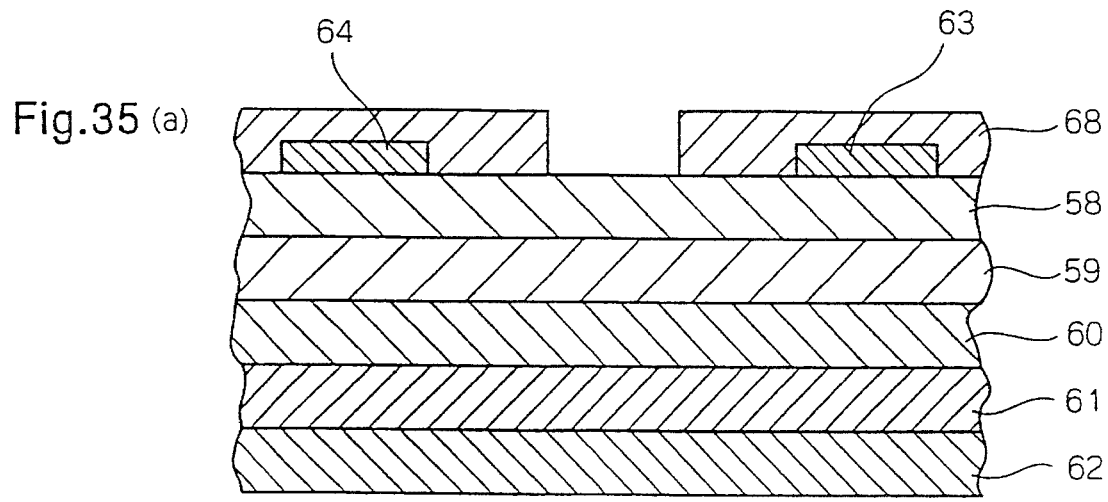
FIGS. 35(a) and 35(b) are sectional views for explaining recess etching of an HEMT using the etchant of the sixth embodiment of the present invention.
Figure 35:
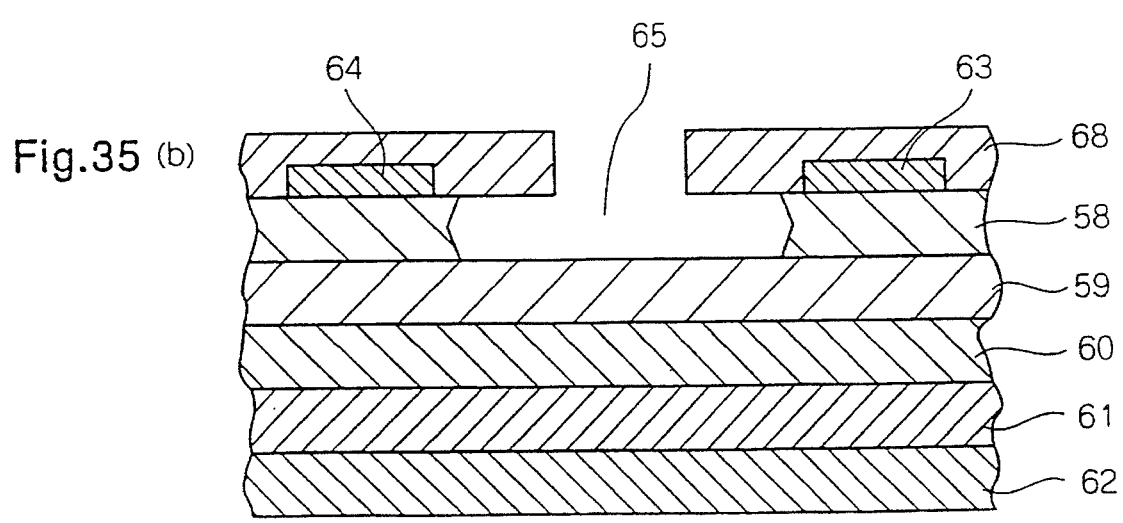
Figure 36:
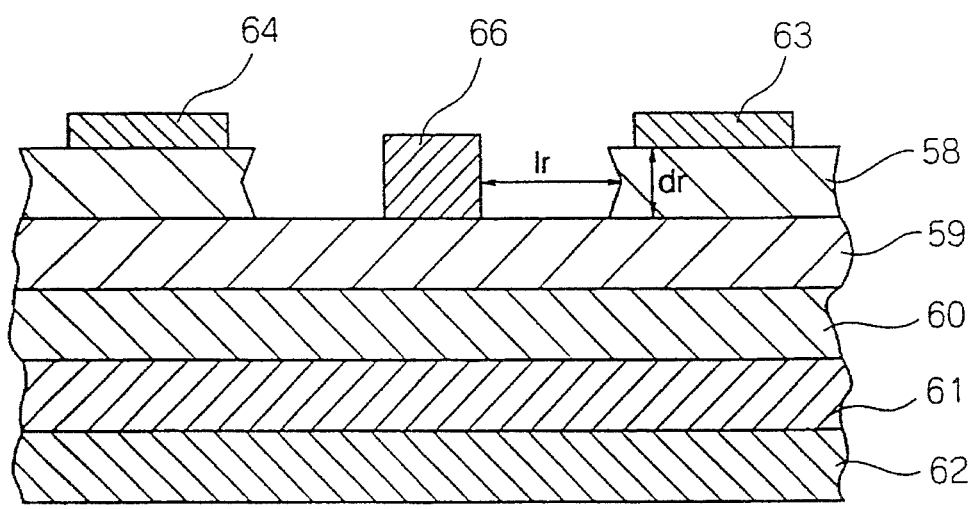
FIG. 36 is a sectional view of an HEMT formed using the etchant of the sixth embodiment.

FIGS. 35(a) and 35(b) are sectional views illustrating process steps for forming a gate recess of an InGaAs/InAlAs HEMT using an etchant in accordance with a sixth embodiment of the present invention. FIG. 36 is a sectional view illustrating a completed structure of the HEMT. In this sixth embodiment, a solution of organic acid in water and hydrogen peroxide in water mixed in a volume ratio of 25:1 and including a basic material in sufficient quantity so that the solution has a pH of 5.15~5.3 is used as an etchant. In FIG. 36, reference numeral 62 designates a semi-insulating InP substrate. An i type $In_{0.52}Al_{0.48}As$ layer 61 is disposed on the InP substrate 62. An i type $In_xGa_{1-x}As$ ($0.53 \leq x \leq 0.8$) layer 60 is disposed on the i type $In_{0.52}Al_{0.48}As$ layer 61. An n type $In_{0.52}Al_{0.48}As$ layer 59 is disposed on the i type $In_xGa_{1-x}As$ layer 60. An n⁺ type $In_{0.53}Ga_{0.47}As$ layer 58 is disposed on the n type $In_{0.52}Al_{0.48}As$ layer 59. A gate electrode 66 is disposed on a part of the n type $In_{0.52}Al_{0.48}As$ layer 59. A source electrode 63 and a drain electrode 64 are disposed on the n⁺ type $In_{0.53}Ga_{0.47}As$ layer 58 at opposite sides of the gate electrode 66. Reference characters dr and lr designate depth and width of a gate recess, respectively.

Figure 37:
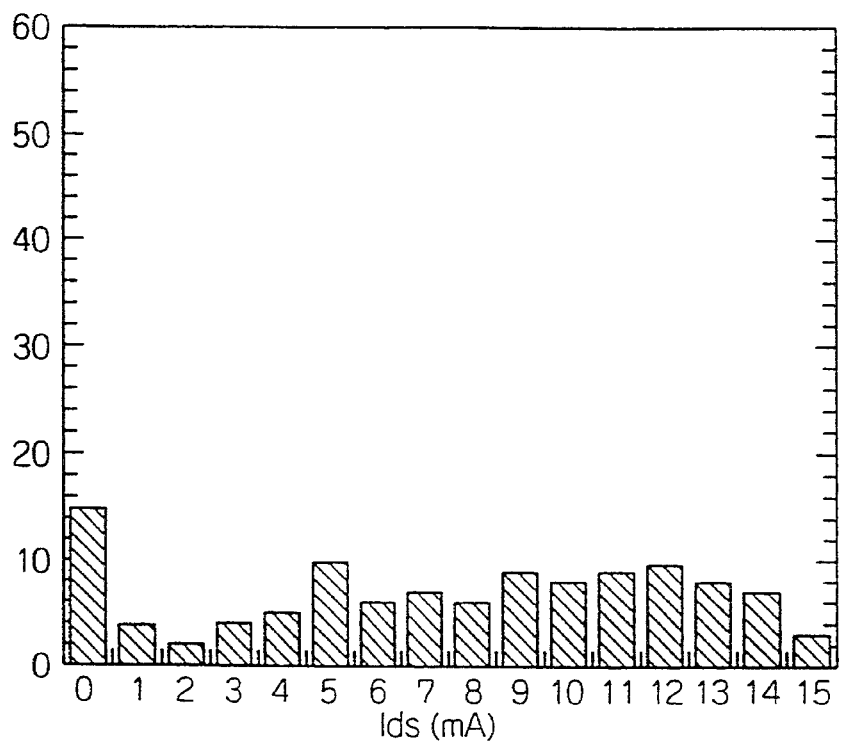
FIGS. 37(a) and 37(b) are graphs illustrating distributions of drain current according to the prior art and the present invention, respectively.
Figure 37:
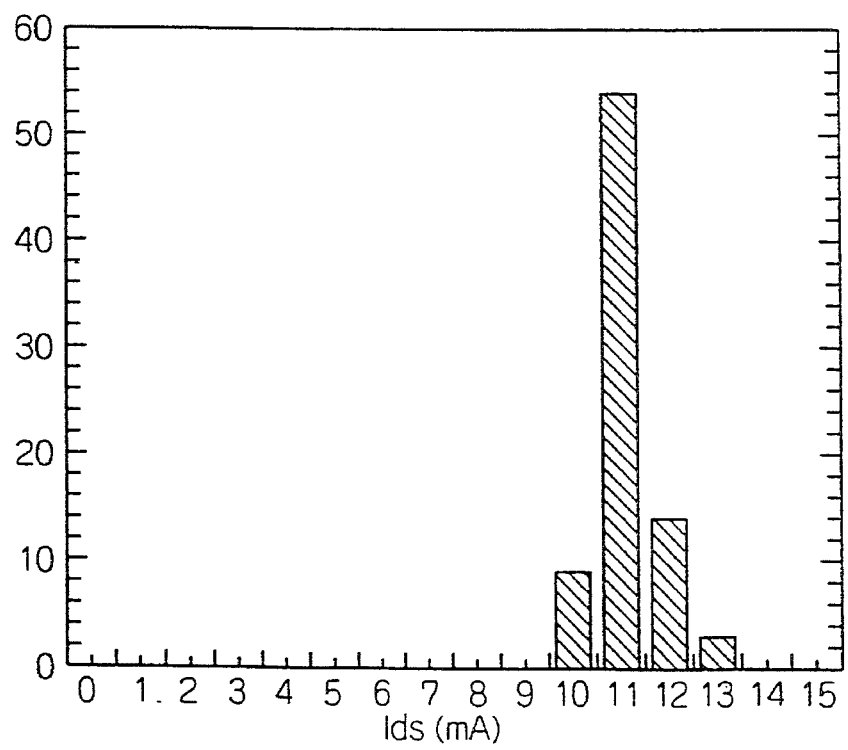

FIGS. 37(a) and 37(b) are graphs illustrating distributions of drain current of an HEMT having a recess formed with a conventional etchant (37(a)) and an HEMT having a recess formed with the etchant according to the sixth embodiment of the present invention (37(b)).

Figure 38:
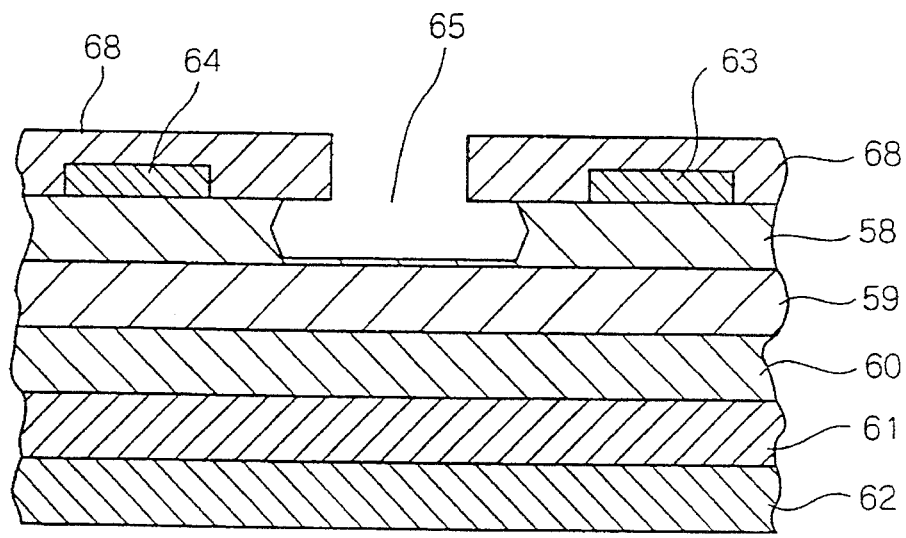
FIGS. 38(a) and 38(b) are sectional views illustrating recess structures of HEMTs formed with a conventional etchant.
Figure 38:
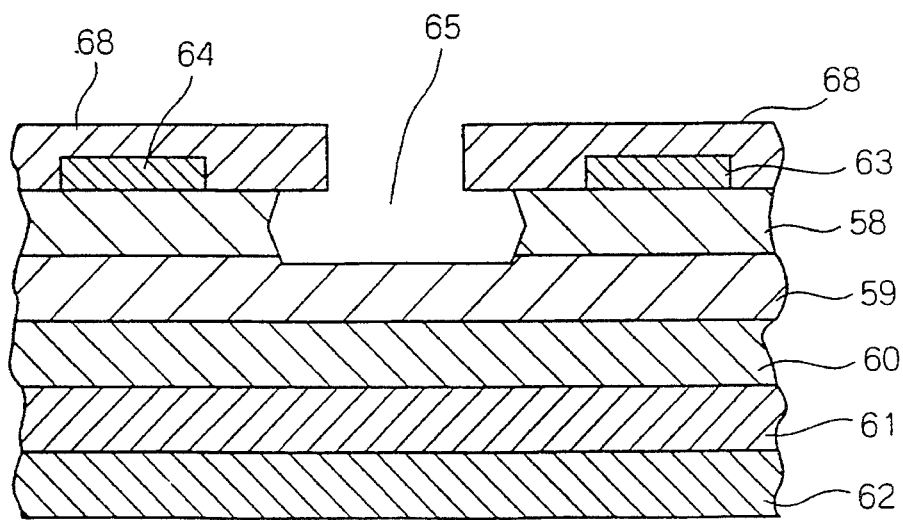

FIGS. 38(a) and 38(b) are sectional views for explaining problems in recess etching using a conventional etchant.

A description is given of recess etching using the etchant according to the sixth embodiment of the present invention.

Initially, the i type $In_{0.52}Al_{0.48}As$ layer 61, the i type $In_xGa_{1-x}As$ ($0.53 \leq x \leq 0.8$) layer 60, the n type $In_{0.52}Al_{0.48}As$ layer 59, and the n⁺ type $In_{0.53}Ga_{0.47}As$ layer 58 are successively grown on the semi-insulating InP substrate 62. Thereafter, the spaced apart source and drain electrodes 63 and 64 are formed, and a photoresist pattern 68 having an opening opposite a region where a gate electrode is to be located is formed on the surface (FIG. 35(a)). Using the resist film 68 as a mask, the n⁺ type $In_{0.53}Ga_{0.47}As$ layer 58 is etched with an etchant comprising a water solution of citric acid (10% by weight) and a water solution of hydrogen peroxide (30% by weight) mixed in a volume ratio of 25:1 and having a pH of 5.15–5.35 until the etching front reaches the n type $In_{0.52}Al_{0.48}As$ layer 59, forming a gate recess 65 (FIG. 35(b)).

In the conventional recess etching of an HEMT, a mixture of phosphoric acid, hydrogen peroxide, and water (=3:1:50) is employed as an etchant. Since the etching rates of the $In_{0.53}Ga_{0.47}As$ layer and the $In_{0.52}Al_{0.48}As$ layer by this etchant are 30 nm/min, the etching depth varies as shown in FIGS. 38(a) and 38(b). That is, in FIG. 38(a), a portion of the $In_{0.52}Al_{0.48}As$ layer 39 is unfavorably over-etched. In FIG. 38(b), the etching front does not reach the $In_{0.52}Al_{0.48}As$ layer 39. These variations in the etching depth cause variations in the threshold voltage and in the drain current of the HEMT, which are represented as follows:

$$V_{th} = \phi - \Delta Ec - \frac{qnd^2}{2\epsilon} \quad (4)$$

where $\phi$ is the Schottky barrier, q is the electron charge, d is the thickness of the electron supply layer, N is the carrier concentration, $\epsilon$ is the dielectric constant, and $\Delta Ec$ is the conduction band discontinuity between InGaAs and InAlAs.

$$I_{ds} = \frac{\epsilon}{d}(V_G - V_{th})V_{sat}Z_G \quad (5)$$

where $V_G$ is the gate bias, $Z_G$ is the gate width, and $V_{sat}$ is the saturation ratio of electrons.

In the HEMT including the gate recess formed using the conventional etchant (FIGS. 38(a)–38(b)), the drain current $I_{ds}$ significantly varies as shown in FIG. 37(a).

On the other hand, the etchant of this sixth embodiment etches the $In_{0.53}Ga_{0.47}As$ layer 58 at a relatively high rate of 31 nm/min and the $In_{0.52}Al_{0.48}As$ layer 59 at a relatively low rate of 0.8 nm/min, so that selective etching of the $In_{0.53}Ga_{0.47}As$ layer 58 is possible. Therefore, the $In_{0.52}Al_{0.48}As$ layer 59 serving as an electron supply layer has a uniform thickness, whereby the drain current $I_{ds}$ is made uniform as shown in FIG. 37(b).

As described above, the etchant according to this sixth embodiment improves uniformity of the recess depth and the drain current $I_{ds}$ of the HEMT.

Furthermore, the etchant of this sixth embodiment realizes a wide recess. That is, as shown in FIG. 35(b), the etching of the $In_{0.53}Ga_{0.47}As$ layer 58 in the direction perpendicular to the surface of the layer 58 stops at the $In_{0.52}Al_{0.48}As$ layer 59 and, thereafter, the $In_{0.53}Ga_{0.47}As$ layer 58 is etched in the horizontal direction to increase the width of the recess. In the recess etching using the conventional etchant, it is very difficult to produce a wide recess because the recess width $1_r$ depends on the recess depth $d_r$. For example, the conventional etchant provides a recess width $1_r$ of 45 nm for a recess depth $d_r$ of 50 nm. On the other hand, the etchant of this sixth embodiment provides a recess width $1_r$ of 95 nm for a recess depth $d_r$ of 50 nm. This wide recess reduces the gate-to-source capacitance and increases the maximum cut-off frequency ft from 108 GHz to 128 GHz. In addition, the maximum stable power gain (60 GHz) is increased from 6 dB to 8 dB.

In this sixth embodiment of the present invention, since a solution comprising an organic acid in water and hydrogen peroxide in water mixed in a volume ratio of 25:1 and having a pH of 5.15–5.35 is employed as an etchant, the etching rate of the $In_{0.53}Ga_{0.47}As$ layer by this etchant is significantly increased to the etching rate of the $In_{0.52}Al_{0.48}As$ layer, so that selective etching of the $In_{0.53}Ga_{0.47}As$ layer with respect to the $In_{0.52}Al_{0.48}As$ layer is possible. Further, when this etchant is employed for recess etching of HEMTs, HEMTs with improved high frequency characteristics are achieved.

Figure 19:
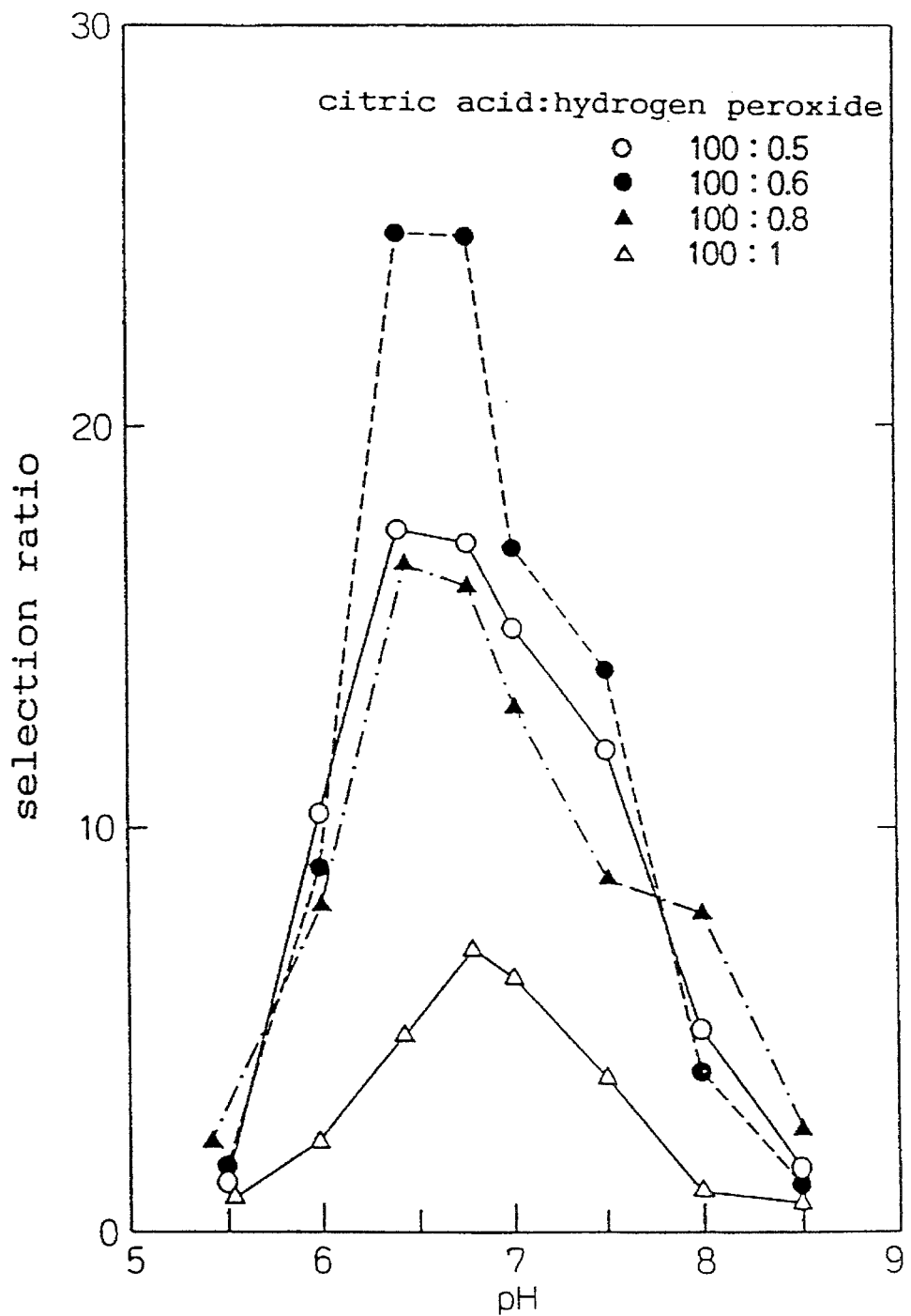
FIG. 19 is a graph illustrating pH dependence of etching rate for explaining an etchant in accordance with a seventh embodiment of the present invention.

FIG. 19 is a graph for explaining an etchant in accordance with a seventh embodiment of the present invention. In this embodiment, a mixture of a water solution of citric acid (2% by weight) and a water solution of hydrogen peroxide (30% by weight) mixed in a volume ratio of 200:1~100:1 to which a basic compound, such as ammonia, is added to control the pH is employed as an etchant. In FIG. 19, the abscissa shows the pH of the etchant, and the ordinate shows the selectivity of the etchant for n-$Al_{0.22}Ga_{0.78}As$ with respect to p-$Al_{0.1}Ga_{0.9}As$ which is obtained by dividing the etching rate of n-$Al_{0.22}Ga_{0.78}As$ by the etching rate of p-$Al_{0.1}Ga_{0.9}As$.

As shown in FIG. 19, when the pH of the etchant is in a range of 6.0–8.0, selective etching of n-AlGaAs with respect to p-AlGaAs is possible because, in this pH range, the selectivity of the etchant for n-$Al_{0.22}Ga_{0.78}$, which is obtained by dividing the etching rate of n-$Al_{0.22}Ga_{0.78}As$ by the etching rate of p-$Al_{0.1}Ga_{0.9}As$, is large.

Figure 20:
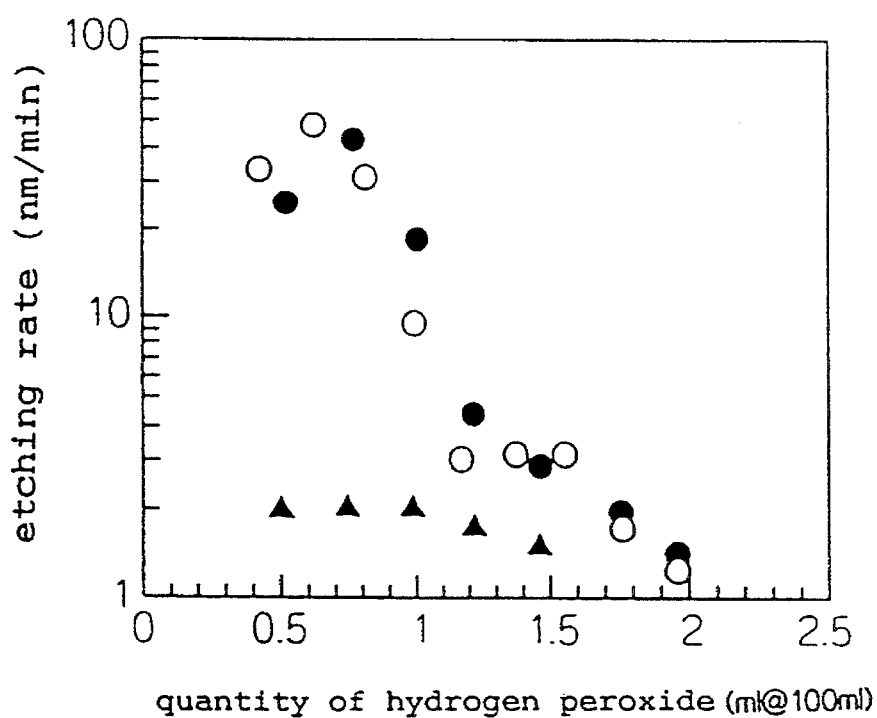
FIG. 20 is a graph illustrating hydrogen peroxide quantity dependence of etching rate for explaining the etchant according to the seventh embodiment.

FIG. 20 is a graph for explaining the etchant according to the seventh embodiment of the present invention, illustrating hydrogen peroxide quantity dependencies of etching rates of p-$Al_{0.1}Ga_{0.9}As$, n-$Al_{0.15}Ga_{0.85}As$, and n-$Al_{0.22}Ga_{0.78}As$ by an etching solution comprising a mixture of a water solution of citric acid (2% by weight) and a water solution of hydrogen peroxide (30% by weight), and a basic compound, such as ammonia, in sufficient quantity so that the solution has a pH of 6.5.

As shown in FIG. 20, when the quantity of hydrogen peroxide in water in the above-described etchant is less than 1 ml while the quantity of citric acid in water is 100 ml, i.e., when the ratio of citric acid in water to hydrogen peroxide water exceeds 100, selective etching of n-AlGaAs with respect to p-AlGaAs is possible. If the ratio of citric acid water to hydrogen peroxide in water is further increased, the etching rates of n-$Al_{0.22}Ga_{0.28}$, n-$Al_{0.15}Ga_{0.85}As$, and p-$Al_{0.1}Ga_{0.9}As$ vary as shown in the following table.

| sample | citric acid in water:hydrogen peroxide in water | | |
|---|---|---|---|
| | 1000:1 | 500:1 | 300:1 |
| n-Al$_{0.22}$Ga$_{0.78}$As | 3.0 | 15.0 | 20.5 |
| n-Al$_{0.15}$Ga$_{0.85}$As | 3.1 | 16.3 | 23.2 |
| p-Al$_{0.1}$Ga$_{0.9}$As | 2.5 | 2.4 | 2.2 |

As shown in this table, an eminent difference in the etching rates between n-AlGaAs and p-AlGaAs is obtained even when the volume ratio of citric acid in water and hydrogen peroxide in water is 500:1. Therefore, it is found that selective etching of n-AlGaAs with respect to p-AlGaAs is possible if the volume ratio is less than 500:1.

Figure 21:
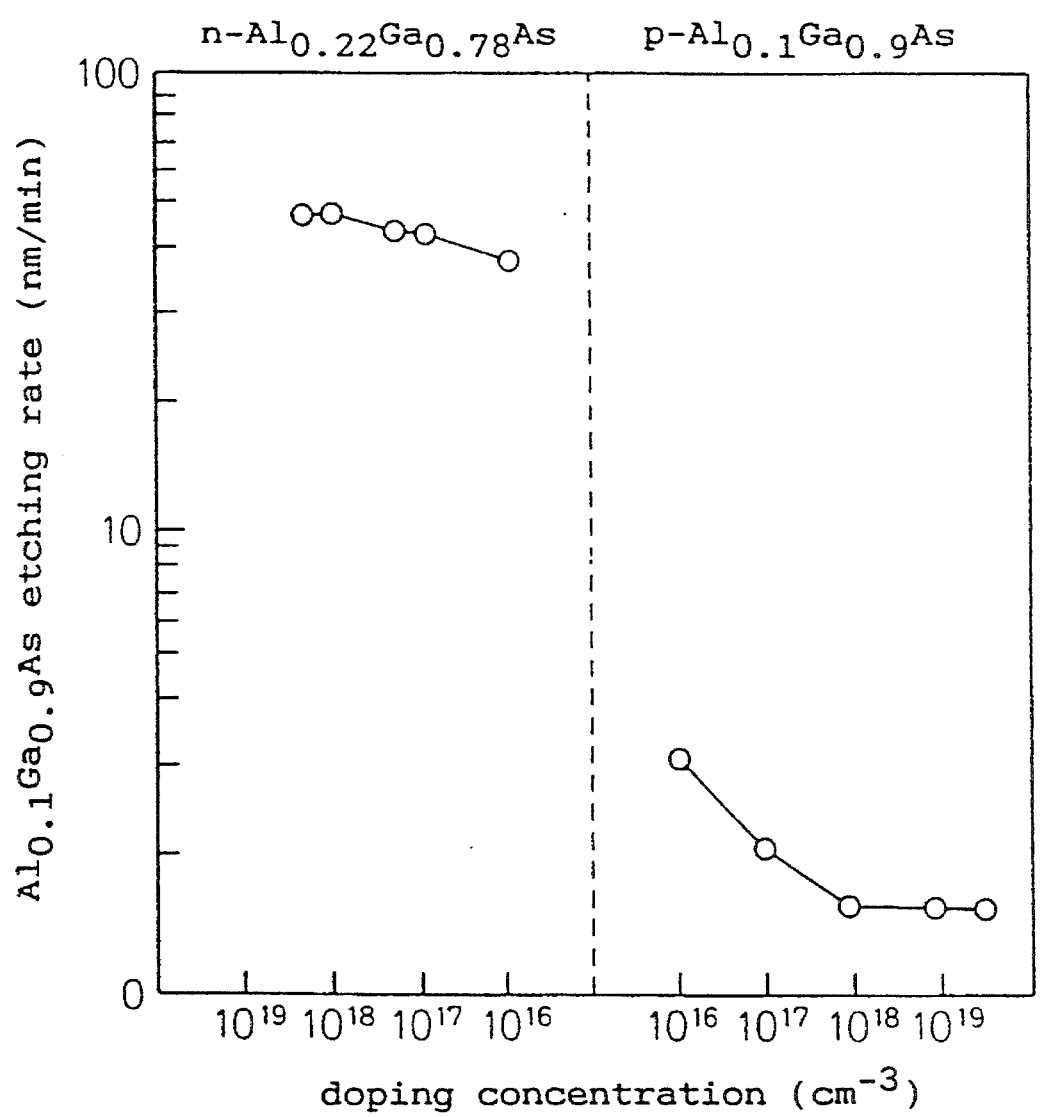
FIG. 21 is a graph illustrating doping concentration dependence of etching rate for explaining the etchant according to the seventh embodiment.

FIG. 21 is a graph illustrating dopant concentration dependence of the etching rate of AlGaAs by an etching solution comprising a water solution of citric acid (2% by weight) and a water solution of hydrogen peroxide (30% by weight) mixed in a volume ratio of 250:1 and having a pH of 6.5.

As shown in FIG. 21, the etching rate of n-Al$_{0.22}$Ga$_{0.78}$As increases with an increase in the dopant concentration. On the contrary, the etching rate of p-Al$_{0.1}$Ga$_{0.9}$As decreases as the dopant concentration increases. Therefore, selective etching is possible if the dopant concentration of AlGaAs is higher than $10^{16}$ cm$^{-3}$.

Figure 22:
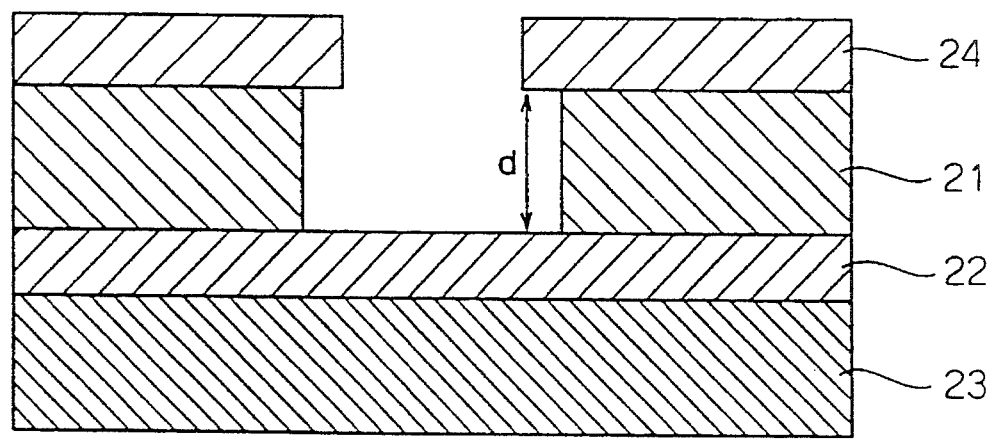
FIG. 22 is a sectional view for explaining an etching method using the etchant of the seventh embodiment.

FIG. 22 is a sectional view illustrating a recess formed using the etchant of this seventh embodiment comprising citric acid in water and hydrogen peroxide in water mixed in a volume ratio of 100:1~500:1 and having a pH of 6.0~8.0. In FIG. 22, reference numeral 21 designates an n type AlGaAs layer, numeral 22 designates a p type AlGaAs layer, numeral 23 designates an n type GaAs layer, and numeral 24 designates an etching mask comprising photoresist. Reference character d designates the etching depth. When the n type AlGaAs layer 21 on the p type AlGaAs layer 22 is etched with this etchant, since the etching rate of the n type AlGaAs layer 21 by this etchant is considerably higher than the etching rate of the p type AlGaAs layer 22, the etching accurately stops at the surface of the p type AlGaAs layer 22, whereby the etching depth d is controlled with high precision.

As described above, in this seventh embodiment of the present invention, a mixture of citric acid in water and hydrogen peroxide in water in a volume ratio of 100:1~500:1 including a basic material in sufficient quantity so that the mixture has a pH of 6.0 to 8.0 is employed as an etchant. Since the etching rate of n-AlGaAs by this etchant is considerably higher than the etching rate of p-AlGaAs, selective etching of n-AlGaAs with respect to p-AlGaAs is possible. When an n type AlGaAs layer disposed on a p type AlGaAs layer is etched with this etchant, the etching depth is controlled to the level of one atomic layer with high precision.

FIGS. 23(a)–23(d) are sectional views illustrating process steps in a method for fabricating an HBT (Heterojunction Bipolar Transistor) in which the etchant according to the above-described seventh embodiment is used in an etching process for exposing a base layer.

Initially, there are successively grown on an n⁻ type GaAs layer about 5000 Å thick, a p type Al$_x$Ga$_{1-x}$As (x: 0.1→ 0) base layer 30 about 1000 Å thick, an n type Al$_x$Ga$_{1-x}$As (x: 0.3→0.1) layer 29 about 500 Å thick, an n type Al$_{0.3}$Ga$_{0.7}$As layer 28 about 1000 Å thick, an n type Al$_x$Ga$_{1-x}$As (x: 0→0.3) layer 27 about 500 Å thick, and an n⁺ type GaAs layer 26 about 2000 Å. Then, a dummy emitter 25 about 3000 Å thick and 3 μm wide is formed on a part of the n⁺ type GaAs layer 26 (FIG. 23(a)).

Figure 23:
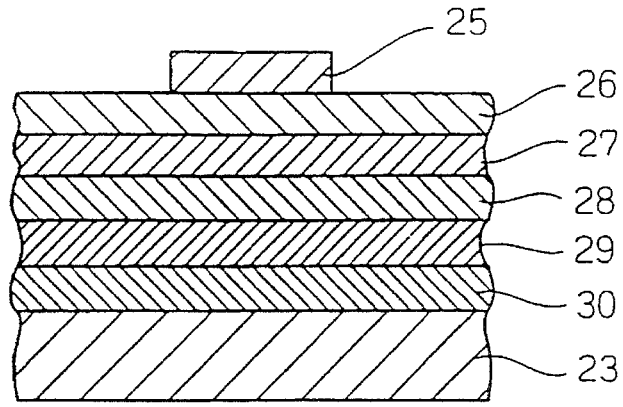
FIGS. 23(a)–23(d) are sectional views for explaining an etching process for exposing a base layer of an HBT in accordance with an eighth embodiment of the present invention.
Figure 23:
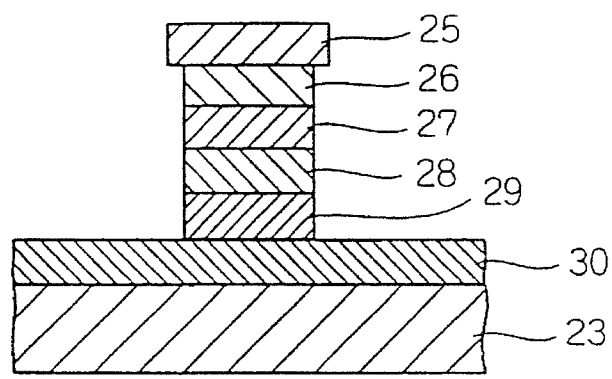
Figure 23:
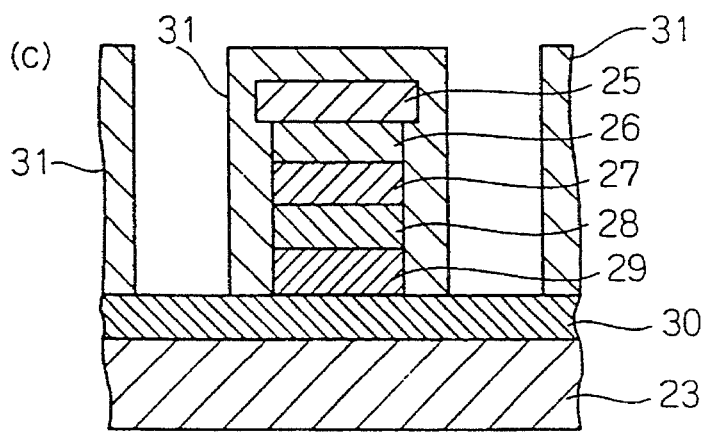
Figure 23:
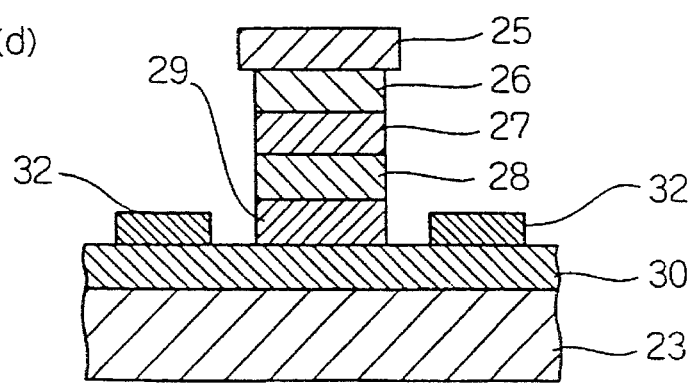

In the step of FIG. 23(b), using the dummy emitter 25 as a mask, those layers 26, 27, 28, and 29 are etched with an etchant comprising a mixture of a water solution of citric acid (2% by weight) and a water solution of hydrogen peroxide (30% by weight) in a volume ratio of 200:1 and having a pH of 6.5, until the surface of the base layer 30 is exposed. The width of the respective layers 26 to 29 after the etching process is about 2.5 μm. Since the etchant used for exposing the surface of the base layer 30 etches n-AlGaAs selectively with respect to p-AlGaAs, the etching accurately stops at the surface of the p type AlGaAs base layer 30.

Thereafter, a photoresist film 31 having openings opposite regions on the base layer 30 where base electrodes are to be located is formed (FIG. 23(c)), followed by metal deposition and lift-off, producing base electrodes 32 (FIG. 23(d)).

As described above, in the prior art etching process for exposing the base layer, over-etching of the base layer causes an unwanted increase in the external base resistance. For example, when the base layer 13 is over-etched as shown in FIG. 10, the external base resistance given by the second term of the equation (2) is increased. Since the maximum oscillation frequency $f_{max}$ of the HBT is given by $$f_{max} = \frac{f_t}{8\pi R_B C_{bc}} \qquad (6)$$

where $C_{bc}$ is the base-to-collector capacitance and $f_t$ is the maximum cut-off frequency, if the external base resistance is increased, the maximum oscillation frequency $f_{max}$ is reduced.

In this eighth embodiment of the present invention, however, since the etching for exposing the base layer 30 employs the etchant according to the seventh embodiment of the present invention, the n type AlGaAs layer 29 is etching selectively with respect to the p type AlGaAs base layer 30, and the etched accurately stops at the surface of the p type AlGaAs base layer 30. Therefore, the reduction in the maximum oscillation frequency of the HBT due to the increase in the external base resistance is suppressed, resulting in a high-performance HBT.

Figure 24:
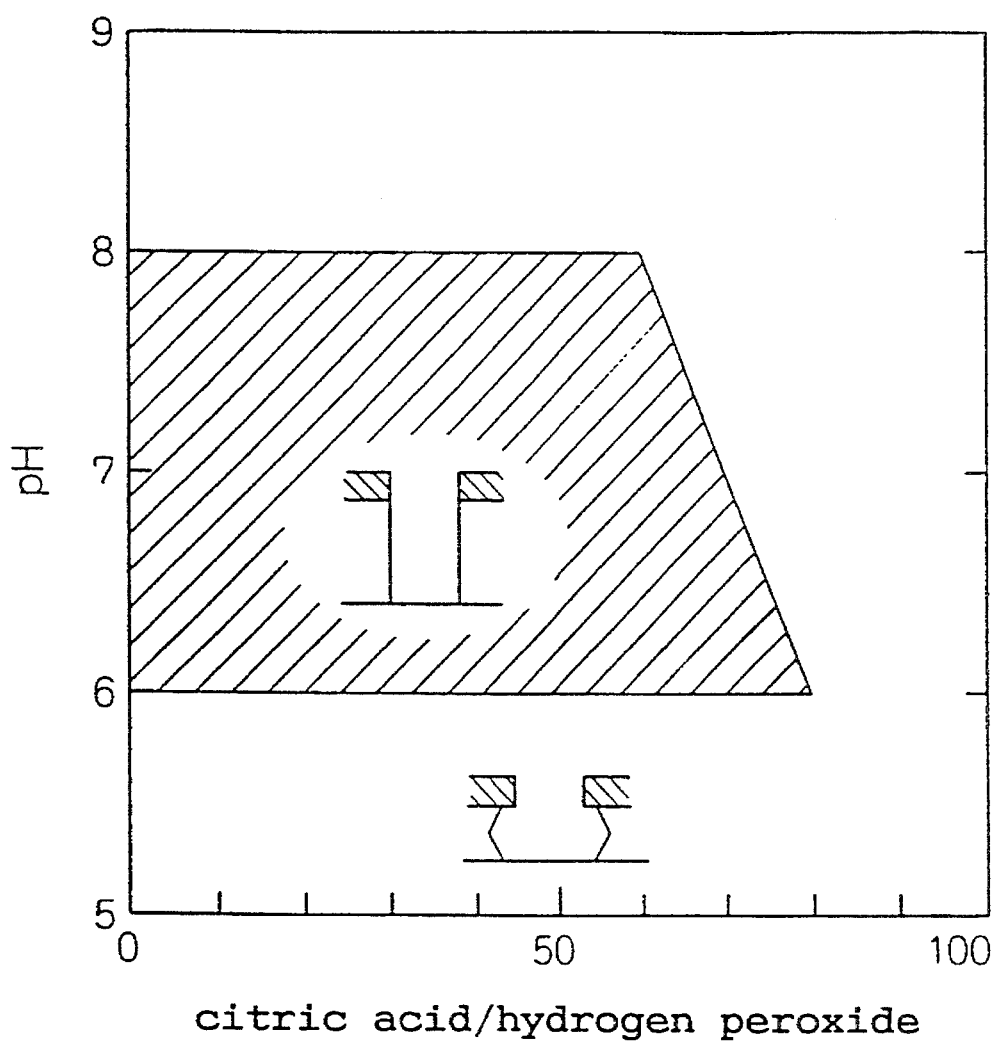
FIG. 24 is a graph illustrating pH and etchant mixing ratio dependence of etching configuration for explaining an etchant in accordance with a ninth embodiment of the present invention.

FIG. 24 is a diagram for explaining an etchant in accordance with a ninth embodiment of the present invention, illustrating pH dependencies of etching configurations when a (100) GaAs surface of a GaAs layer is etched with an etchant comprising a mixture of a water solution of citric acid (2% by weight) and a water solution of hydrogen peroxide (30% by weight) in a volume ratio of citric acid in water to hydrogen peroxide in water less than 80. In FIG. 24, an etchant employed in this ninth embodiment is indicated by the hatched region. That is, the etchant of this ninth embodiment has a volume ratio of citric acid in water to hydrogen peroxide in water of less than 80 and a pH of 6 to 8.

An etching process using the etchant of this ninth embodiment will be described in comparison with a conventional etching process.

Figure 32:
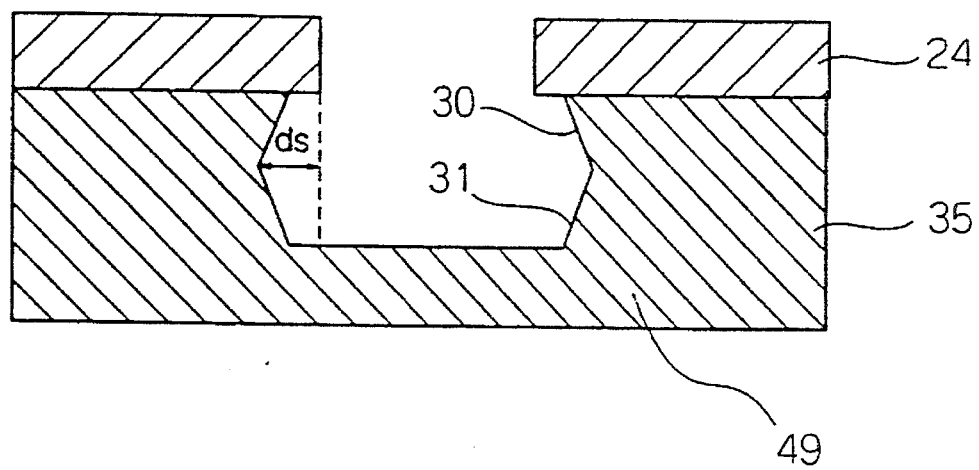
FIG. 32 is a sectional view for explaining recess etching using a conventional etchant.

FIG. 32 is a sectional view of a GaAs layer 35 taken along a (011) plane 49 when a GaAs (100) surface is etched with a conventional etchant comprising phosphoric acid, hydrogen peroxide, and water (=3:1:50). In this case, portions of the GaAs layer 35 are over-etched with respect to the etching mask 24, and a (111) Ga plane 30 and a (111) As plane 31 appear at the side wall of the recess. A depth $d_s$ of this over-etching is about 80% of the etching depth in the direction perpendicular to the GaAs (100) surface.

Figure 25:
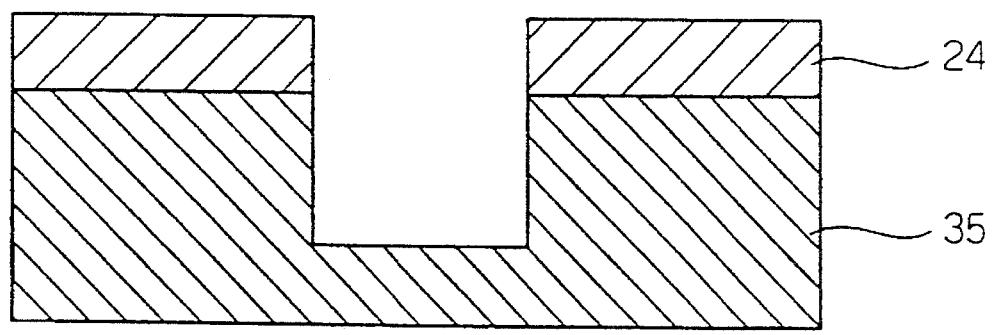
FIG. 25 is a sectional view for explaining an etching method using the etchant of the ninth embodiment.

On the other hand, FIG. 25 is a sectional view of a GaAs layer 35 taken along a (011) plane when a GaAs (100) surface is etched with an etchant comprising a water solution of citric acid (2% by weight) and a water solution of hydrogen peroxide (30% by weight) mixed in a volume ratio of 50:1 and having a pH of 6.5. In this case, a vertical etching configuration having no over-etching with respect to the etching mask 24 is achieved. That is, the etchant having a volume ratio of citric acid water to hydrogen peroxide in water of less than 80 and a pH of 6 to 8 according to this ninth embodiment realizes anisotropic etching with no over-etching with respect to the etching mask, which has been difficult in conventional wet etching techniques. This anisotropic etching is performed only when the {100} GaAs surface is etched with the above-described etchant.

A description is given of the principle of the anisotropic etching realized by the etchant of this ninth embodiment.

Figure 26:
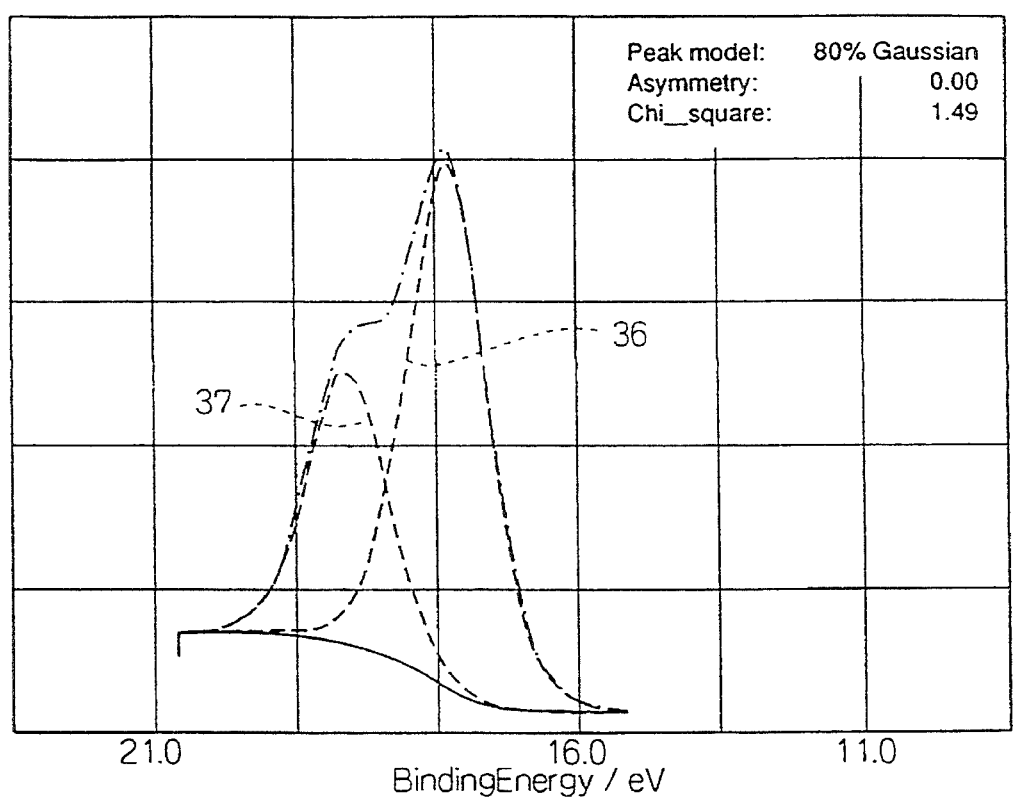
FIG. 26 is a graph illustrating XPS spectra at a GaAs surface after an etching process with the etchant of the eighth embodiment.
Figure 27:
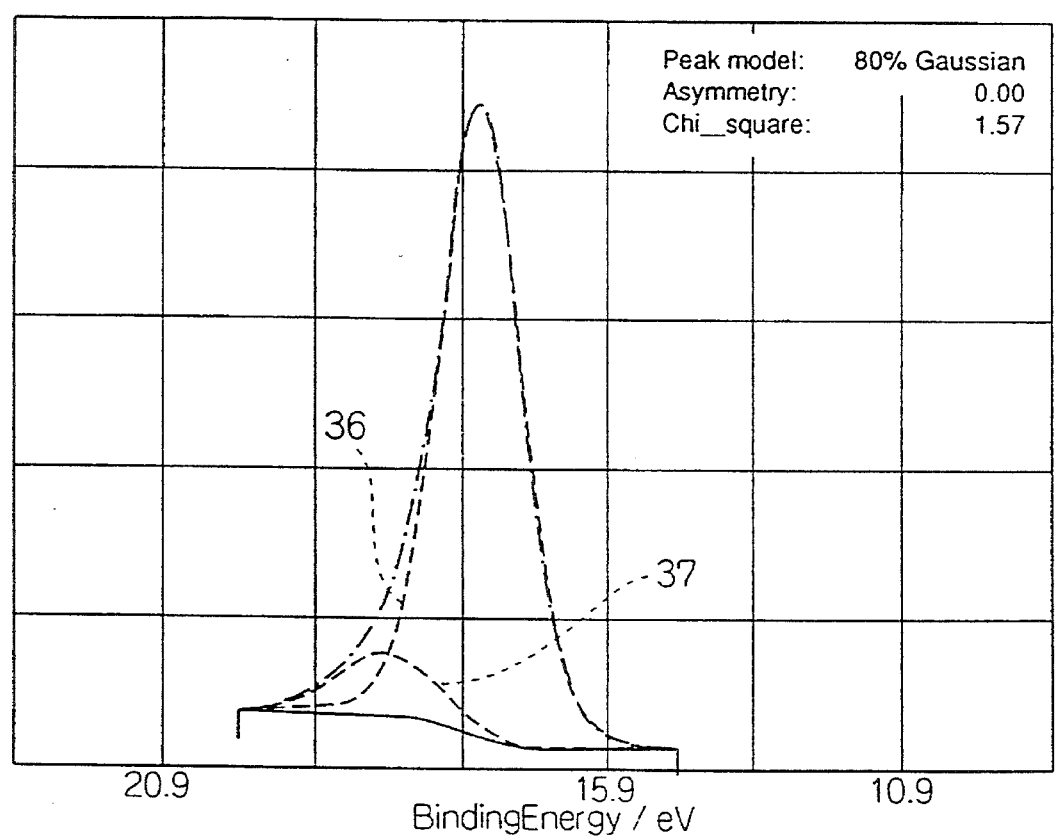
FIG. 27 is a graph illustrating XPS spectra at a GaAs surface after an etching process with a conventional etchant.

FIGS. 26 is a graph illustrating XPS spectra at the (100) GaAs surface after the etching process using the above-described etchant comprising citric acid water and hydrogen peroxide water (=50:1) and having a pH of 6.5. FIG. 27 is a graph illustrating XPS spectra at the (100) GaAs surface after the etching process using the conventional etchant-comprising phosphoric acid, hydrogen peroxide, and water (=3:1:50). In these figures, reference numeral 36 designates an XPS spectrum of Ga of GaAs and numeral 37 designates an XPS spectrum of $Ga_2O_3$. As shown in FIG. 26, at the (100) GaAs surface etched with the etchant of this ninth embodiment, the ratio of $Ga_2O_3$ to Ga metal is relatively large. However, as shown in FIG. 27, at the (100) GaAs surface etched with the conventional etchant, the ratio of $Ga_2O_3$ to Ga metal is very small. The result shown in FIG. 26 indicates that a large quantity of $Ga_2O_3$ is deposited on the (111) Ga plane and forms a side wall protecting film that prevents over-etching.

As described above, since the etchant employed in this ninth embodiment has a volume ratio of organic acid in water to hydrogen peroxide water of less than 80 and a pH of 6 to 8, selective etching is performed in a direction perpendicular to the {100} GaAs surface, whereby anisotropic etching perpendicular to the {100} GaAs surface and having no over-etching with respect to the etching mask is realized.

Japanese Published Patent Application No. Sho. 63-29518 discloses an etching method using an etchant including an organic acid and hydrogen peroxide in water as main constituents in which the ratio of the organic acid and hydrogen peroxide in water is varied to control the shape of groove formed in a GaAs substrate. However, this prior art method is not for preventing over-etching. More specifically, in this prior art, the shape of the side wall of the groove formed in the GaAs layer is varied by selectively making the Ga plane and the As plane inactive using an etchant in which the mixture ratio of the organic acid and hydrogen peroxide in water is varied. This is completely different from the etching method of the ninth embodiment of the present invention in which a large quantity of $Ga_2O_3$ is deposited on the Ga plane by control of the pH of the etchant to produce a protection film that prevents unwanted over-etching at the side wall of the recess.

Figure 28:
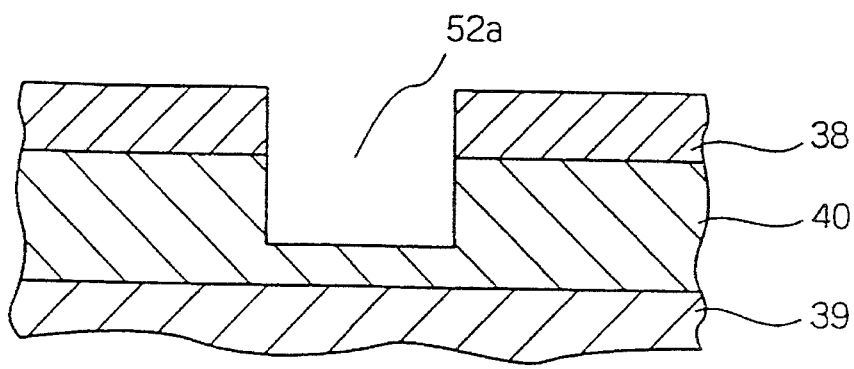
FIGS. 28(a)–28(c) are sectional views illustrating process steps for fabricating a T-shaped gate FET in accordance with a tenth embodiment of the present invention.
Figure 28:
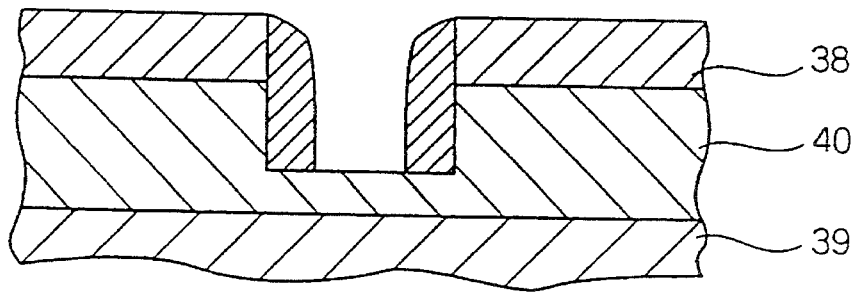
Figure 28:
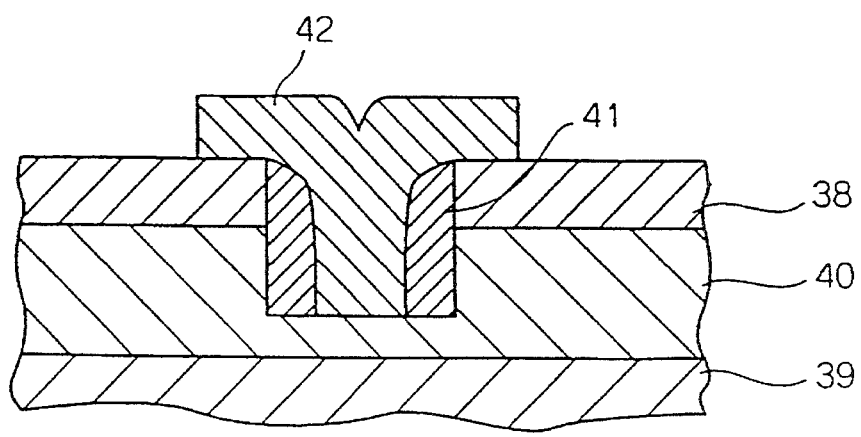

FIGS. 28(a)–28(c) are sectional views illustrating process steps for fabricating a T-shaped gate type field effect transistor (hereinafter referred to as T-gate FET) using the etchant according to the above-described ninth embodiment. In these figures, reference numeral 38 designates an $SiO_2$ insulating film about 3000 Å thick, numeral 39 designates a GaAs buffer layer, numeral 40 designates an n type GaAs layer about 5000 Å thick, numeral 41 designates $SiO_2$ side walls, numeral 52a designates a recess having a width of about 1 μm and a depth of about 6500 Å, and numeral 42 designates a T-shaped gate electrode comprising WSi. The T-shaped gate electrode 42 may comprise other refractory metals which are usually employed as gate metals.

FIGS. 33(a)–33(e) are sectional views illustrating process steps for fabricating a T-gate FET using a conventional etchant. In these figures, the same reference numerals as in FIGS. 28(a)–28(c) designate the same or corresponding parts. Reference numeral 52 designates a recess, numeral 53 designates $SiO_2$ side walls, numeral 54 designates a T-shaped gate electrode comprising WSi, and numeral 55 designates drain electrodes.

Figure 33:
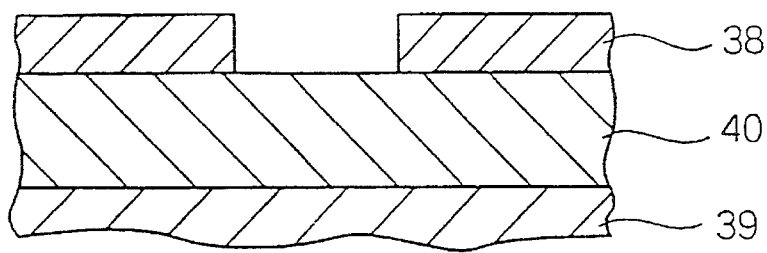
FIGS. 33(a)–33(e) are sectional views illustrating process steps for fabricating a T-shaped gate FET using a conventional etchant.
Figure 33:
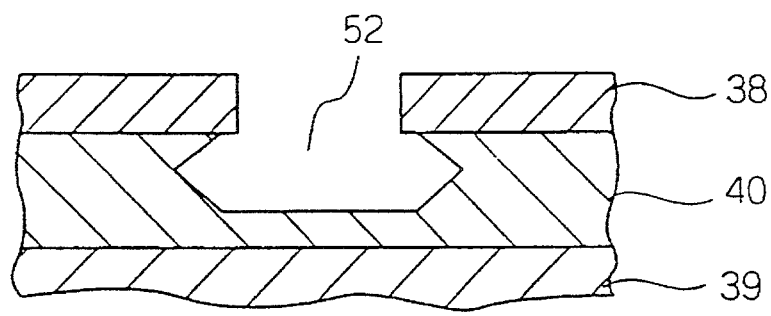
Figure 33:
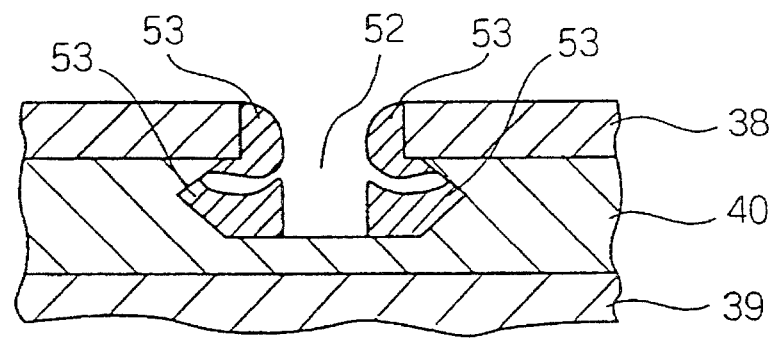
Figure 33:
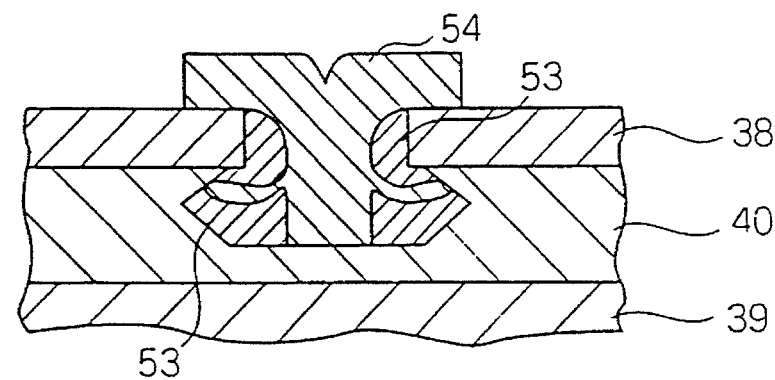
Figure 33:
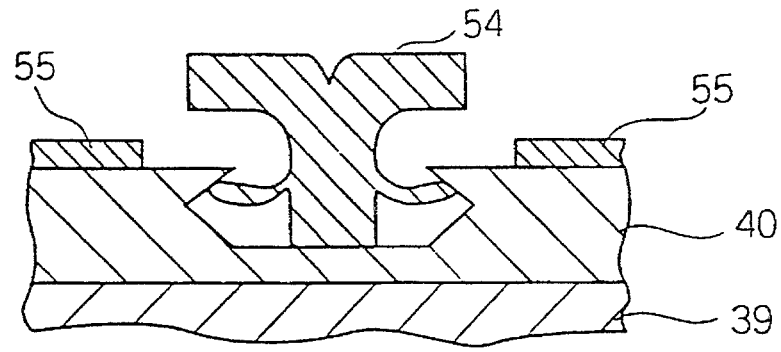

First of all, the conventional process steps will be described. After the $SiO_2$ insulating pattern 38 is formed on the n type GaAs layer 40 (FIG. 33(a)), the n type GaAs layer 40 is etched with an etchant comprising phosphoric acid, hydrogen peroxide, and water (=3:1:50) using the insulating pattern 38 as a mask, forming the recess 52. During the etching process, portions of the GaAs layer 40 under the etching mask 38 are over-etched as shown in FIG. 33(b). This over-etching produces a hole in each of the side walls 53 formed on the opposite side surfaces of the recess 52. When the gate metal 34, such as WSi, is deposited in the recess 52 by sputtering, the gate metal 34 is unfavorably in contact with the n type GaAs layer 20 as shown in FIG. 33(d), resulting in an FET with poor characteristics.

On the other hand, when the etching for forming a gate recess of FET is carried out using an etchant comprising a mixture of a water solution of citric acid (2% by weight) and a water solution of hydrogen peroxide (30% by weight) in a volume ratio of 50:1 and having a pH of 6.5, a recess 52a having vertical side surfaces that are not over-etched with respect to the etching mask 38 is produced as shown in FIG. 28(a). Therefore, the side walls 41 with no holes are formed on the internal side surfaces of the recess 52a (FIG. 28(b)), whereby an ideal T-shaped gate 42 is produced as shown in FIG. 28(c), resulting in a T-gate FET with excellent characteristics. In order to produce the vertical recess structure 52a shown in FIG. 28(a), the surface of the n type GaAs layer 20 subjected to the etching must be a {100} GaAs surface.

In this tenth embodiment of the present invention, since an etchant having a volume ratio of organic acid in water to hydrogen peroxide in water of less than 80 and a pH of 6 to 8 according to the ninth embodiment is used for formation of a gate recess of a T-gate FET, a gate recess with vertical side walls is produced, resulting in a T-gate FET with excellent characteristics.

A description is given of an etching process for producing a via-hole using the etchant of the ninth embodiment of the present invention, in accordance with an eleventh embodiment of the present invention.

Figure 29:
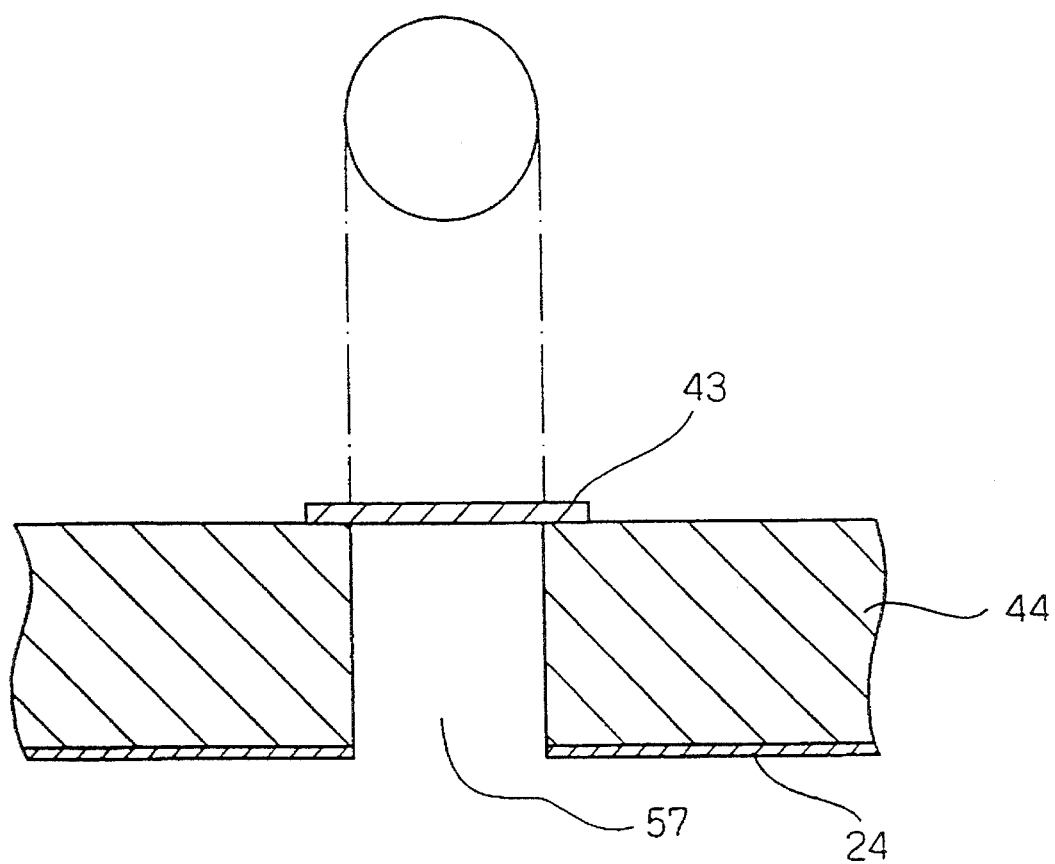
FIG. 29 is a sectional view illustrating a via-hole in accordance with an eleventh embodiment of the present invention.

FIG. 29 is a sectional view for explaining the etching process. In the figure, reference numeral 57 designates a via-hole having a diameter of 30~150 μm, numeral 24 designates an etching mask, such as a resist film, having a thickness of about 5 μm, numeral 43 designates a source electrode about 3500 Å thick, and numeral 44 designates a GaAs substrate 30~100 μm thick.

Figure 34:
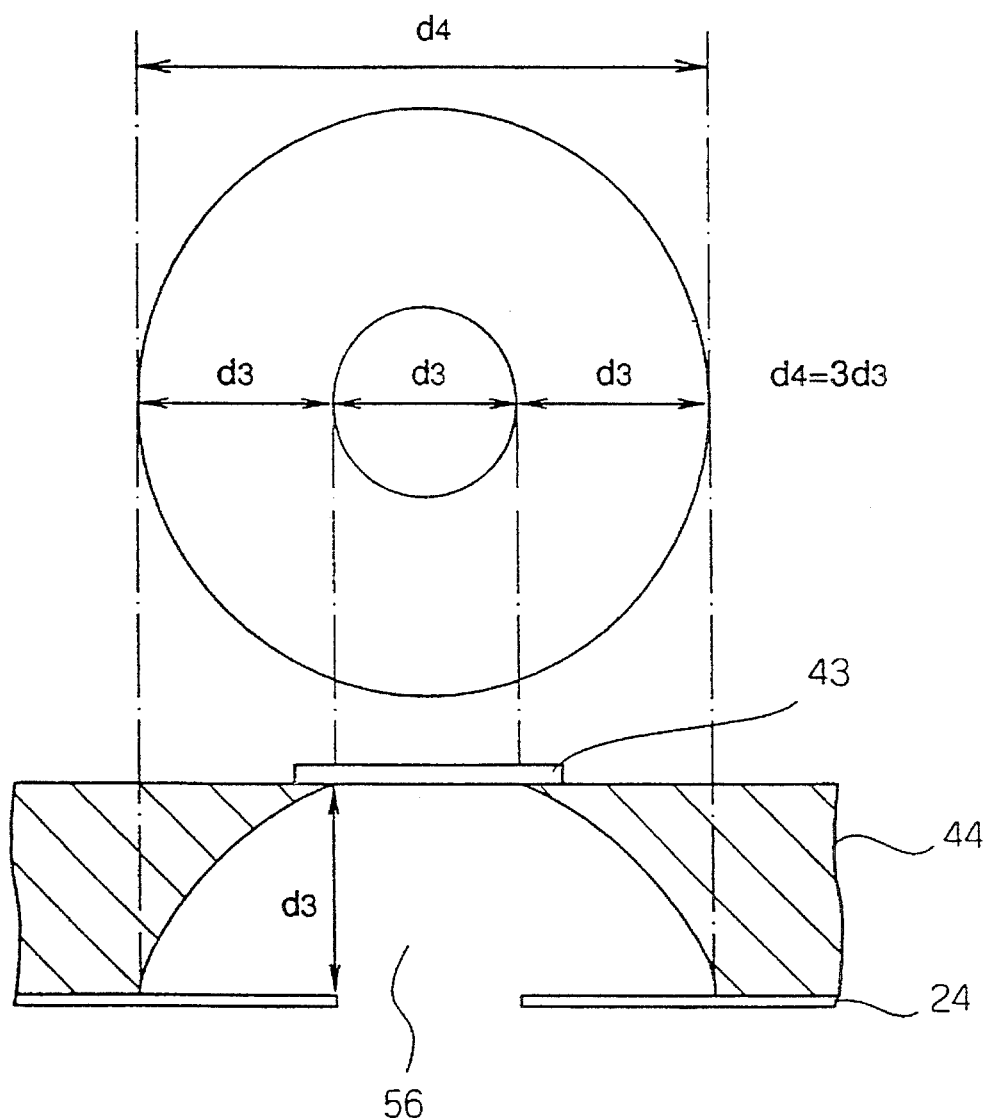
FIG. 34 is a sectional view illustrating a via-hole formed with a conventional etchant.

FIG. 34 is a diagram illustrating a via-hole formed with a conventional etchant. The same reference numerals as in FIG. 29 designate the same or corresponding parts. Reference numeral 56 designates a conventional via-hole formed by wet etching.

Initially, the conventional etching process will be described. As shown in FIG. 34, when the via-hole 56 is formed by etching the substrate 44 having a thickness $d_3$ with a conventional etchant comprising sulfuric acid and hydrogen peroxide (=1:1) using the etching mask 24 having an opening, over-etching corresponding to a distance $d_3$ from an edge of the etching mask 24 at the aperture occurs. Assuming that the diameter of the opening of the etching mask 24 is $d_3$, the diameter of the opening of the via-hole 56 at the front surface of the substrate 44 where the source electrode 43 is present is $d_3$, and the diameter of the opening of the via-hole 56 at the rear surface of the substrate 44 where the etching mask 24 is present is $3d_3$. That is, in order to produce the via-hole 56 having a diameter $d_3$ for the source electrode side opening, an area larger than the diameter $d_3$ is needed.

On the other hand, when the etchant comprising a mixture of a water solution of citric acid (2% by weight) and a water solution of hydrogen peroxide (30% by weight) in a volume ratio of 50:1 and having a pH of 6.5 is employed, since no over-etching with respect to the etching mask 24 occurs as shown in FIG. 29, a via-hole 57 having a diameter $d_3$ for both the mask side opening and the source electrode side opening is produced, and the area needed for the via-hole 57 is reduced to 1/9 of the conventional wet via-hole 56 shown in FIG. 34. In order to obtain the vertical via-hole shown in FIG. 29, the surface of the GaAs substrate 44 subjected to the etching must be a {100} GaAs surface.

According to the eleventh embodiment of the present invention, since the etchant having a volume ratio of organic acid in water to hydrogen peroxide in water of less than 80 and a pH of 6 to 8 is employed for formation of the via-hole, the cross-sectional of the via-hole perpendicular to the depth of the via-hole at every position is of the same size as the opening of the etching mask, whereby the area of the substrate required for the via-hole is reduced. As a result, reduction in chip size of a monolithic microwave IC (MMIC) having via-holes is realized.

A description is given of a method for deciding the ratio Ga:As at a {100} GaAs surface using the etchant of the above-described ninth embodiment, according to a twelfth embodiment of the present invention.

Figure 30:
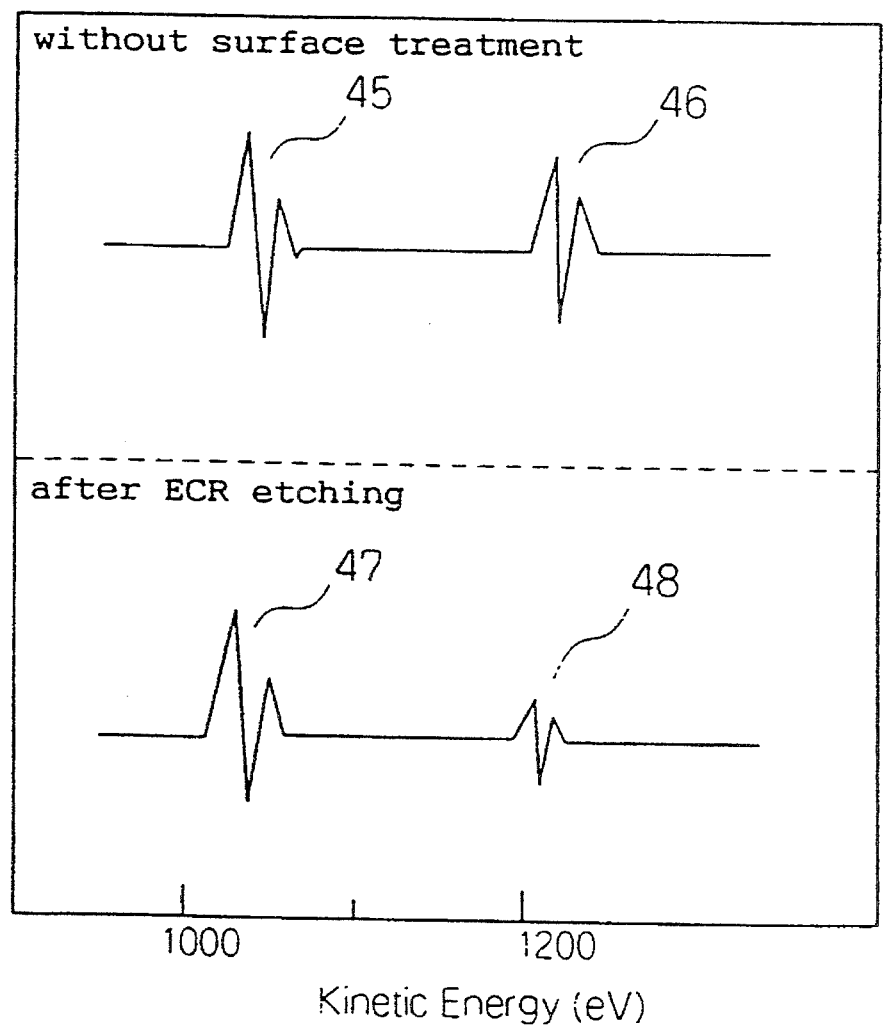
FIG. 30 is a diagram illustrating Auger spectra at GaAs surface in accordance with a twelfth embodiment of the present invention.
Figure 31:
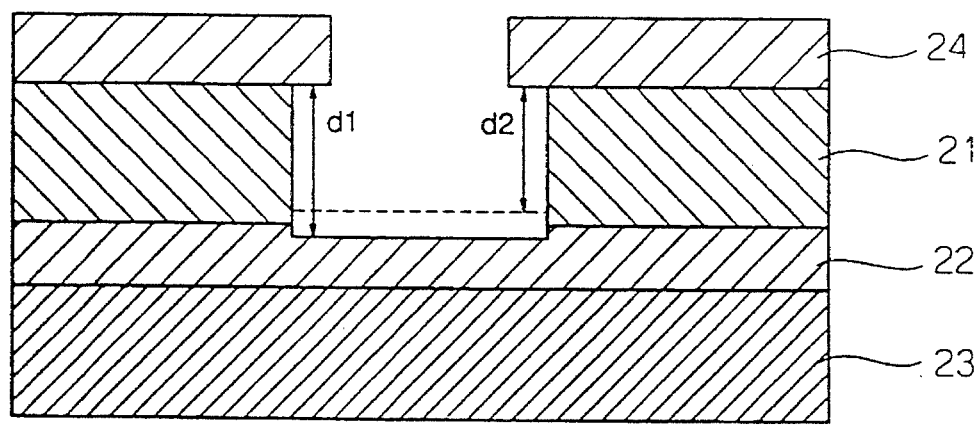
FIG. 31 is a sectional view for explaining an etching process using a conventional etchant.

FIG. 30 is a diagram illustrating Auger spectra at a (100) GaAs surface, for explaining the Ga:As evaluation method of this twelfth embodiment. In FIG. 30, reference numerals 45 and 46 designate Auger peaks of Ga and As in GaAs, respectively, and reference numerals 47 and 48 designate Auger peaks of Ga and As, respectively, after ECR (Electron Cyclotron Resonance) etching.

When the etchant comprising citric acid in water and hydrogen peroxide in water mixed in a volume ratio of 50:1 and having a pH of 6.5 is applied to a GaAs surface to which no treatment is applied and to a GaAs surface after ECR etching treatment, the etchant etches the former GaAs surface but does not etch the latter GaAs surface. This result is attributed to the fact that the ratio of Ga at the surface is increased after the ECR etching as indicated by the Auger peak of Ga 47 in FIG. 30 and a large quantity of $Ga_2O_3$, that prevents the etching, is produced at the surface. That is, the possibility of etching depends on the ratio of Ga to As at the {100} GaAs surface.

In this twelfth embodiment of the present invention, an etchant having a volume ratio of citric acid in water to hydrogen peroxide in water of less than 80 and a pH of 6~8 is applied to a {100} GaAs surface (first surface) whose ratio of Ga to As is measured in advance to know if this etchant can etch the {100} GaAs surface. Thereafter the same etchant is applied to a second {100} GaAs surface (second surface) whose ratio of Ga to As is unknown because of etching or surface treatment. The ratio of Ga to As of the second {100} GaAs surface is decided by whether the etchant etches the second {100} GaAs surface.

What is claimed is:

1. An etching method for etching an InGaAs layer selectively with respect to an InAlAs layer comprising etching with a solution comprising a mixture of an organic acid and hydrogen peroxide, and a base in sufficient quantity so that the solution has a pH of 5.15 to 5.3.

2. An etching method for etching an n type AlGaAs layer selectively with respect to a p type AlGaAs layer comprising etching with a solution comprising a mixture of an organic acid and hydrogen peroxide, and a base in sufficient quantity so that the solution has a pH of 6.0 to 8.0.

3. An etching method for etching a {100} GaAs surface of a GaAs layer selectively in a direction perpendicular to the surface comprising etching with a solution comprising a mixture of an organic acid and hydrogen peroxide including a base in sufficient quantity so that the solution has a pH of 6.0 to 8.0.

4. A method for detecting the ratio of Ga to As at a {100} GaAs surface of a GaAs layer comprising:

preparing an etching solution comprising a mixture of an organic acid, hydrogen peroxide, and a base in sufficient quantity so that the solution has a pH of 6.0 to 8.0 for etching a first {100} GaAs surface having a known ratio of Ga to As; and etching a second {100} GaAs surface different from the first {100} GaAs surface with said etching solution and determining the ratio of Ga to As of the second {100} GaAs surface by whether said etching solution etches the second {100} GaAs surface.

5. An etching solution for etching an n type AlGaAs layer selectively with respect to a p type AlGaAs layer comprising a solution of an organic acid and hydrogen peroxide including a base in sufficient quantity so that the solution has a pH of 6.0 to 8.0.

6. An etching solution for etching a {100} GaAs surface of a GaAs layer selectively in a direction perpendicular to the surface comprising a solution of an organic acid and hydrogen peroxide including a base in sufficient quantity so that the solution has a pH of 6.0 to 8.0.

* * * * *